(12) United States Patent
Huang et al.

(10) Patent No.: US 7,474,040 B2
(45) Date of Patent: Jan. 6, 2009

(54) MULTI-OUTPUT PIEZOELECTRIC INVERTER AND TRANSFORMER THEREOF

(75) Inventors: Yao-Tien Huang, Taipei (TW); Wen-Hsin Hsiao, Taipei (TW); Yen-Chieh Wang, Taipei (TW); Yu-Yuan Chen, Taipei (TW); Wen-Jong Wu, Taipei (TW); Chih-Kung Lee, Taipei (TW)

(73) Assignee: National Taiwan University, Taipei (TW)

( * ) Notice: Subject to any disclaimer, the term of this patent is extended or adjusted under 35 U.S.C. 154(b) by 49 days.

(21) Appl. No.: 11/619,909

(22) Filed: Jan. 4, 2007

(65) Prior Publication Data

US 2007/0152539 A1    Jul. 5, 2007

(30) Foreign Application Priority Data

Jan. 5, 2006  (TW) .............................. 95100524 A

(51) Int. Cl.
*H01L 41/08* (2006.01)
(52) U.S. Cl. ...................................... 310/365; 310/366
(58) Field of Classification Search ................. 310/328, 310/330, 359, 366; 315/209 PZ
See application file for complete search history.

(56) References Cited

U.S. PATENT DOCUMENTS

| | | | | |
|---|---|---|---|---|
| 2,943,278 A | * | 6/1960 | Oskar | ........................ 333/32 |
| 2,976,501 A | * | 3/1961 | Oskar | ........................ 333/32 |
| 5,241,236 A | * | 8/1993 | Sasaki et al. | ................ 310/358 |
| 5,504,384 A | * | 4/1996 | Lee et al. | .................... 310/359 |
| 5,939,818 A | * | 8/1999 | Hakamata | .................... 310/359 |
| 6,051,915 A | * | 4/2000 | Katsuno et al. | ............. 310/359 |
| 6,118,209 A | * | 9/2000 | Okuyama et al. | ........... 310/358 |
| 6,140,747 A | * | 10/2000 | Saito et al. | .................... 310/359 |
| 6,566,820 B2 | * | 5/2003 | Kim et al. | ............. 315/209 PZ |
| 6,586,863 B2 | * | 7/2003 | Kim et al. | .................... 310/359 |
| 7,030,538 B2 | * | 4/2006 | Nakatsuka et al. | ........... 310/312 |
| 7,038,354 B2 | * | 5/2006 | Takeda et al. | .......... 310/316.01 |
| 7,145,281 B2 | * | 12/2006 | Takeda et al. | .......... 310/316.01 |

* cited by examiner

*Primary Examiner*—Mark Budd
(74) *Attorney, Agent, or Firm*—Volpe and Koenig PC

(57) ABSTRACT

In the present invention, a dual-output piezoelectric transformer for driving at least two loads is provided. The dual-output piezoelectric transformer comprises a piezoelectric piece, a set of input electrodes mounted centrally on a first and a second sides of the piece with a first polarization direction along a thickness direction of the piece, and a first and a second output electrodes polarized reversely in a second polarization direction and respectively mounted around surfaces of two ends of the piece with the second polarization direction being a longitudinal direction of the piece.

7 Claims, 27 Drawing Sheets

(a)          (b)

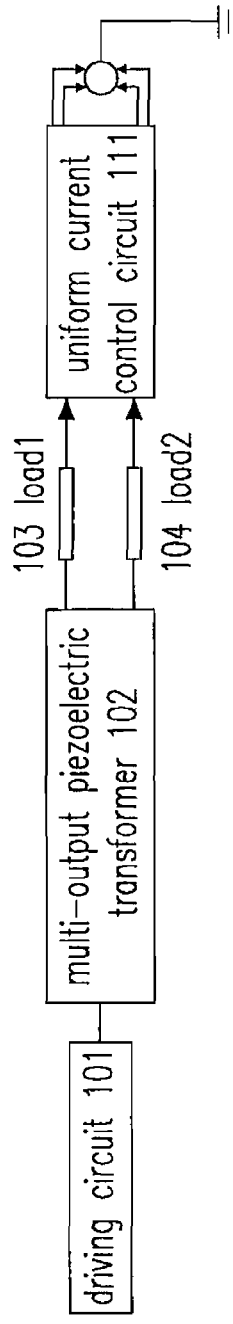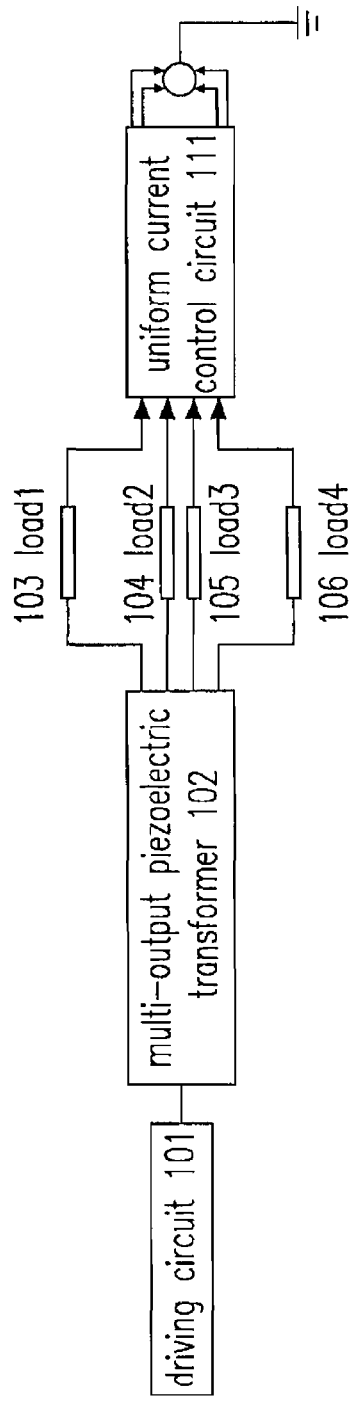
Fig. 11(a)
Fig. 11(b)

MULTI-OUTPUT PIEZOELECTRIC INVERTER AND TRANSFORMER THEREOF

FIELD OF THE INVENTION

The present invention relates to a multi-output piezoelectric inverter, wherein the characterized core piezoelectric transformer is applied to transforming a power to supply electrical energy for at least two loads. The present invention is mainly applied to the power module of back light of LCD, wherein the featured piezoelectric transformer bears the decreased effects thereon from the impedance variations of the loads and for addressing the lighting problem in driving at least two cold cathode fluorescent lamps simultaneously thereby.

BACKGROUND OF THE INVENTION

Currently, the back light systems of the liquid crystal displays (LCDs) including large-scale LCD TVs and middle-scale LCDs for notebooks mainly utilize cold cathode fluorescent lamps for providing necessary light thereof. As the scale of the LCD TV increases, there are design principles therefor further proposed, wherein hot cathode fluorescent lamps with high watt quantity and low operation voltage are provided for back light of the LCD TV.

No matter they are cold or hot cathode fluorescent lamps, the operations for both the lamps are characterized for high impedance before being lightened up, wherein an extremely high voltage is necessary therefor. After the lamps are lightened up, the impedance of the lamps thereof would decrease, and the voltage drop for keeping the lamps light is rather lower than that for lighting up. Compared with the traditional electromagnetic transformer for the power module of the back light, the piezoelectric transformer bears such advantages as high efficiency in transformation, low emitting heat, small and low profiled, high safety, and convenience in manufacture thereof. Besides, the piezoelectric transformer is inherently characterized in having different step-ups for different impedance of loads in accordance with the characteristics of the cold/hot cathode fluorescent lamps, wherein the piezoelectric transformer affords to provide an extremely high voltage applied to the cold/hot cathode fluorescent lamps when they are in a high-impedance state before being lightened up, and further provides an appropriate operation voltage for the lamps when the step-ups for the piezoelectric transformer decrease as the impedance of the lamps decreases after they are lightened up.

However, for the power module of the back light applying the traditional electromagnetic transformer thereto, it is necessary to utilize voltage proof capacitors in series with the lamps for sharing redundant voltages. Accordingly, the piezoelectric transformer is inherently characterized in better performances for lightening up the cold and hot cathode fluorescent lamps compared with the electromagnetic transformer. Recently, there are discussions on substituting the piezoelectric transformer for the electromagnetic transformer.

As the production of the LCD TVs grows accompanying relative decrease on the price thereof, it becomes an important as to how to lower the cost for manufacturing the driving circuit for the LCD TVs, wherein it is a challenge for designing a new inverter to drive at least two cold fluorescent lamps simultaneously. In comparison with the traditional electromagnetic transformer, there is a fatal defect against lighting up in the piezoelectric transformer on the issue of driving at least two cold cathode fluorescent lamps. As abovementioned, the step-ups of the piezoelectric transformer depend on the impedance of loads, and therefore the piezoelectric transformer connected to multiple lamps might result in a decrease of the whole step-ups therein as a result of lighting up a certain lamp firstly and lead to insufficient voltage in other voltage output terminals to lighting up the other lamps, referred as a lighting issue herein. Accordingly, the present invention provides a multi-output piezoelectric transformer characterized in that the structure and the electrode configurations thereof are so designed to achieve the purpose of reducing the effects of the variations of the impedance connected to the output terminals on the steps-up of the piezoelectric transformer and overcome the lighting issue of the multi-output piezoelectric inverter for driving lamps effectively.

The present invention provides a multi-output piezoelectric transformer utilizing the configurations of the piezoelectric resonant vibration and the output and input terminals designed to light up at least two cold cathode fluorescent lamps and lower the cost for the power module of the back light effectively to boost the competitiveness for the piezoelectric transformer in the LCD TV business.

SUMMARY OF THE INVENTION

The present invention provides a multi-output piezoelectric transformer including multi-output electrodes thereof for driving multiple loads simultaneously. There are mainly three different types of multi-output transformers provided in the present invention.

The first type of dual-type piezoelectric transformer is the piezoelectric transformer 11 driven centrally and outputting symmetrically in respect of two sides thereof as illustrated in FIG. 1. The piezoelectric transformer 11 is an elongated, flaky rectangular plate constituted by piezoelectric ceramic materials, wherein the input terminal in the center of the piezoelectric transformer 11 is polarized in the thickness direction, and the electrodes 12 and 13 are respectively on the back and front surfaces for the input terminal, one and the other of which are connected for an input voltage and for a reference voltage respectively for the piezoelectric transformer 11. Two sides of the piezoelectric transformer 11 are output terminals, wherein they are polarized in reverse directions where the piezoelectric transformer 11 is elongated, and output terminals 14 and 15 are respectively connected to two loads. The operation mode selected therefor in the present invention is a third-order resonant mode vibrating transversely along the x-direction in FIG. 1, wherein the displacement 16 and stress distribution 17 therefor are illustrated. The piezoelectric transformer 11 which is driven centrally and outputs symmetrically in respect of the two sides thereof is designed as the following principles: (1) the two output terminals therefor are separated by the central input terminal and symmetrically arranged for reducing the effects of different impedance of loads on the whole step-ups of the piezoelectric transformer 11; (2) three nodes maintaining zero displacement in operation of the piezoelectric transformer 11 are at a distance of one-sixth of the length from the two sides thereof and in the center thereof respectively, wherein the nodes maintaining zero displacement are appropriate for holders designed for the piezoelectric transformer 11.

The second type of dual-output piezoelectric transformer inherits the design of the centrally driven piezoelectric transformer 11, wherein the functions for the configurations of the input electrodes in the piezoelectric transformer 11 are further designed for a modal centrally driven piezoelectric transformer 162. The modal centrally driven piezoelectric transformer 162 has effects of modal filtering for direct use of voltage of square waves to drive the piezoelectric transformer. Corresponding descriptions therefor are as follows.

The governing equation for the piezoelectric transformer in one dimension transverse vibration with length, width and height denoted as L, W, and H respectively are illustrated as equation (1), wherein c denotes Young's modulus of the piezoelectric material, ρ denotes the density of the piezoelectric material, u denotes the transverse displacement, $E_3^{in}$ denotes the magnitude of the electric field of the input terminal, $e_{31}$ denotes the piezoelectric stress/charge constant, and A(x) denotes the distribution of the configuration of the input electrodes in the longitudinal direction.

$$c\frac{\partial^2 u}{\partial x^2} - \rho\frac{\partial^2 u}{\partial t^2} = E_3^{in} e_{31} \frac{\partial A(x)}{\partial x} \quad (1)$$

The ends on the two boundaries, i.e. x=0 and x=L, of the piezoelectric transformer driven centrally and outputting on two sides thereof are free from applied forces, wherein the boundary conditions for the output terminals thereof are expressed as formulae (2) and (3) respectively as follows, wherein $h_{33}$ denotes the piezoelectric stress/voltage constant, and $D_3^{out}(0,t)$ and $D_3^{out}(L,t)$ respectively denotes the displacements at x=0 and x=L.

$$0 = HW\left[c\frac{\partial u}{\partial x} - h_{33}D_3^{out}(x,t)\right]\bigg|_{x=0} \Rightarrow \frac{\partial u}{\partial x}\bigg|_{x=0} = \frac{h_{33}D_3^{out}(0,t)}{c} \quad (2)$$

$$0 = HW\left[c\frac{\partial u}{\partial x} - h_{33}D_3^{out}(x,t)\right]\bigg|_{x=l} \Rightarrow \frac{\partial u}{\partial x}\bigg|_{x=L} = \frac{h_{33}D_3^{out}(L,t)}{c} \quad (3)$$

The partial differential equation in formula (1) is solved by introducing the eigenfunction expression $\phi_i(x)$ as follows, wherein $A_i(t)$ denotes the weight of the displacement of the piezoelectric transformer in the modal coordinate, i denotes the operation mode of the piezoelectric transformer, and $\phi_i(x)$ denotes the eigen function with eigen values $\lambda_i$ therefor:

$$u(x,t) = \sum_{i=1}^{\omega} A_i(t)\varphi_i(x) \quad (4)$$

$$\varphi_i = \sqrt{\frac{2}{L}}\cos\sqrt{\lambda_i}\,x \quad \lambda_i = \left(\frac{i\pi}{L}\right)^2 \quad (5)$$
$$i = 1, 2, 3 \ldots$$

In the case with the output for a close loop or two identical loads, the partial differential equation issue in the original formula (1) is transformed into multiple ordinary differential equations based on the orthogonal condition on the eigen functions therefor, wherein $q_i(t)$ in formula (7) is the driving item for the second order ordinary differential function in the formula (6).

$$\frac{d^2 A_i(t)}{dt^2} + \frac{c}{\rho}\lambda_i A_i(t) = q_i(t) \quad (6)$$

$$q_i(t) = \int_0^L \left(-\frac{e_{31}E_3^{in}}{\rho}\frac{\partial A(x)}{\partial x}\right)\varphi_i dx \quad (7)$$

It derives from the formula (7) that the input electrodes designed according to the orthogonal characteristic of the eigen functions $\phi_i(x)$ could perform modal filtering functions for the piezoelectric transformer. Therefore, the input electrode configurations A(x) are designed for the operation mode in a third mode expressed as formula (8).

$$A(x) = \sin\left(\frac{3\pi x}{L}\right)\left\{H\left[x - \frac{L}{3}\right] - H\left[x - \frac{2L}{3}\right]\right\} \quad (8)$$

It derives from the formula (8) for the desired configurations of the input electrodes as illustrated in FIG. 2, wherein the length of the piezoelectric transformer is normalized for the corresponding electrode configurations 21. The driving items in the governing equation of the formula (6) are thus demonstrated as follows by substituting the formula (8) into (7).

$$q_i(t) = \frac{e_{31}}{\rho}\sqrt{\frac{2}{L}}\frac{3\pi}{L}\left(\frac{\sin\left[\frac{2}{3}(l-3)\pi\right]}{2(l-3)\pi} + \frac{\sin\left[\frac{2}{3}(l+3)\pi\right]}{2(l+3)\pi} - \frac{\sin\left[\frac{1}{3}(l-3)\pi\right]}{2(l-3)\pi} - \frac{\sin\left[\frac{1}{3}(l+3)\pi\right]}{2(l+3)\pi}\right) E_3^{in}(t) \quad (9)$$

Supposed that the piezoelectric transformer is driven by the square wave of the frequency of the third resonant vibration, then the input voltage $E_3^{in}(t)$ is expressed as follows, wherein $\omega_3$ is the operation frequency of the third resonant vibration and $(2n-1)\omega_3 = \omega_{3(2n-1)}$.

$$E_3^{in}(t) = E\sum_{n=1}^{\omega}\frac{1}{(2n-1)\pi}\cos[(2n-1)\omega_3 t] \quad (13)$$

It is demonstrated from the formula (13) that the square wave voltage for driving could be divided into combinations of high order sinusoidal waves odd times of the frequency of the square wave. In view of the formulae (13) and (9) entirely, it also appears that the driving items are all zero for the odd operation frequency $\omega_{3(2n-1)}$, i.e. i=3(2n-1), of the driving voltage, and that the piezoelectric transformer characterized in the specific input electrodes configurations therefor bears excellent performances of modal filtering on the input voltage of square waves. For being distinguished from the traditional piezoelectric transformer with electrodes uniformly distributed therefor, the configuration functions 31 of the electrodes therefor are illustrated in FIG. 3. For comparing the driving efficiency factor with the electrodes distributed uniformly and the modal electrodes to external electric fields for resonant structures of different orders of piezoelectric transformer, the third-order driving efficiency factor 41 of the modal electrode of the piezoelectric transformer, and the third-order, the ninth-order and the fifteen-order driving efficiencies 42, 43 and 44 of the uniformly distributed electrodes of the transformers are respectively illustrated in FIG. 4.

In summation, the modal piezoelectric transformer which is centrally driven has three nodes with zero displacement for convenience in designing external holders therefor. Besides, the high frequency noise of the square waves from the driving source are filtered automatically based on the design on the modal electrodes, wherein the inductor for filtering conventionally is spared in the driving circuit of the piezoelectric transformer to achieve the design of the piezoelectric inverter free from coils thoroughly by the substitution of the piezoelectric transformer thereto. Furthermore, the lighting issue on multiple lamps for the piezoelectric transformer would be overcome based on the symmetric outputs on two sides to drive two cold cathode fluorescent lamps simultaneously.

The third type of multi-output piezoelectric transformer is a disk-shaped multi-output piezoelectric transformer of a circular piezoelectric ceramic flake, wherein the input terminal is positioned in the central area thereof, and the input electrodes therefor are positioned on the back and the front of the flake and polarized in the thickness direction of the flake. The output terminals for the multi-output piezoelectric transformer are distributed uniformly around the circular piezoelectric ceramic flake according to the numbers of the output terminals, which are configured mainly as crescents and designed in the same way. The electrodes for the output terminals are positioned at the edges of the circular piezoelectric ceramic flake, and the output terminals are polarized in a radial direction in respect of the center of the output electrodes thereof. Since the output terminals on the disk-shaped multi-output piezoelectric transformer are arranged symmetrically, the effects of the loads on the step-ups of the disk-shaped multi-output piezoelectric transformer are thus reduced for addressing the lighting issue on the disk-shaped multi-output piezoelectric transformer applied to multiple lamps.

FIG. 5(a) illustrates a disk-shaped dual-output piezoelectric transformer 51, wherein the input terminals therefor are positioned in the central area, and the input electrodes 52 are configured as biaxial symmetry, distributed on the front and the back, and polarized in the thickness direction of the transformer as illustrated in FIG. 5(b). Furthermore the two output terminals for the disk-shaped piezoelectric transformer are positioned in two edge blocks thereof and, wherein the output electrodes 53 and 54 thereof are positioned at the edge of the disk-shaped piezoelectric transformer, and the output terminals are polarized in a radial direction in respect of the centers of the output electrodes 53 and 54.

FIG. 7 illustrates a disk-shaped quadric-output piezoelectric transformer 71. The input terminals of the disk-shaped quadric-output piezoelectric transformer 71 are positioned in a central area thereof, and the electrodes 76 of the input terminals are configured as biaxial symmetry and distributed on a front and a back thereof, wherein they are polarized in the thickness direction of the transformer. The four output terminals of the disk-shaped quadric-output piezoelectric transformer with configurations close to crescents are respectively positioned in equal edge blocks thereof, wherein the electrodes 72, 73, 74, and 75 are positioned at the edges of the disk-shaped quadric-output piezoelectric transformer, and the output terminals are polarized in a radial direction in respect of centers of the output electrodes 72, 73, 74, and 75.

All the three types of multi-output piezoelectric transformers mentioned above can drive a number between two and four different loads. Based on the inherent structure of the surface electrodes in the piezoelectric transformer driven centrally and outputting on two sides thereof, the effects of resonant vibration of the disk-shaped piezoelectric transformer would disappear in the three or five times higher frequencies. Accordingly, square waves are directly applicable for driving.

As illustrated in FIGS. 10(a) and (b), a multi-output piezoelectric transformer is applicable to a multi-output piezoelectric inverter for driving multiple loads simultaneously, wherein a uniform current control circuit 111 is further included in FIGS. 11(a) and (b). The multi-output piezoelectric inverter at least comprises: a multi-output piezoelectric transformer 102, a driving circuit 101, and at least two loads 103, 104, 105 and 106, which are corresponding to the cold cathode fluorescent lamps 171, 172, 173 and 174 in FIGS. 17(a) and (b) and in FIGS. 18(a) and (b) respectively, connected to different output electrodes of the piezoelectric transformer. The driving circuit 101 mainly comprises integrated circuits and switches for controlling the driving frequencies of the piezoelectric transformer therethrough. The driving circuit 101 could comprise an integrated control circuit 131 receiving a feedback signal and adjusting operation frequencies and MOSFETs 132 and 133 able to resist high operation voltage as illustrated in FIGS. 13(a) and (b), wherein outputs of the integrated control circuit are for switching the MOSFETs of high voltage to generate a high square wave voltage. In view of the mentioned driving circuit different from the conventional piezoelectric transformer, the multi-output piezoelectric transformer of the present invention is designed in this way that the driving circuit directly drives the piezoelectric transformer by square waves. Accordingly, the design for filtering is simplified for the driving circuit.

As illustrated in FIGS. 12(a) and (b), a feedback control circuit 121 is added to the driving circuit for controlling the piezoelectric transformer to operate near an optimal operation frequency since the operation efficiency of the piezoelectric transformer varies with the operation frequency thereof, wherein the feedback control circuit 121 determines the operation state of the different loads with impedance, and correspondingly transmits determined signals for the of the driving circuit for the controlling process thereof.

There are various control factors as for feedback control, two of which are taken for example herein. In the first control factor, the output currents of the piezoelectric transformer is controlled to be constant for controlling the piezoelectric transformer to operate in the frequency of optimal efficiencies, wherein the control circuit 1211 for control the output currents of the piezoelectric transformer to be constant could comprise an output-current detector 134 and a constant current-feedback control circuit 135 as illustrated in FIG. 13. In the second control factor, the determined phase difference between the input voltage and the output current is fixed at a constant value for constricting the piezoelectric transformer to operate in the frequency of highest efficiency as illustrated in FIGS. 14(a) and (b), wherein the control circuit 1212 for controlling the phase difference between the input and the output to be constant could comprise a delay-lock current detector 141 and a delay-lock feedback control circuit 142.

Assuming that the loads of the multi-output piezoelectric inverter are lamps and it is necessary to control the output pipe currents to be constant for maintaining the uniformity of brightness of each of the lamps, an uniform current control circuit 111 could thus be added to the driving circuit to adjust the currents output to the loads to be identical.

Other objects, advantages and efficacies of the present invention will be described in detail below taken from the preferred embodiments with reference to the accompanying drawings, in which:

BRIEF DESCRIPTION OF THE DRAWINGS

FIG. 11 is a diagram showing the driving circuit including the uniform current control circuit of the multi-output piezoelectric transformer for (a) two loads of impedance and (b) four impedance loads in the present invention;

DETAILED DESCRIPTION OF THE PREFERRED EMBODIMENT

Figure 1:
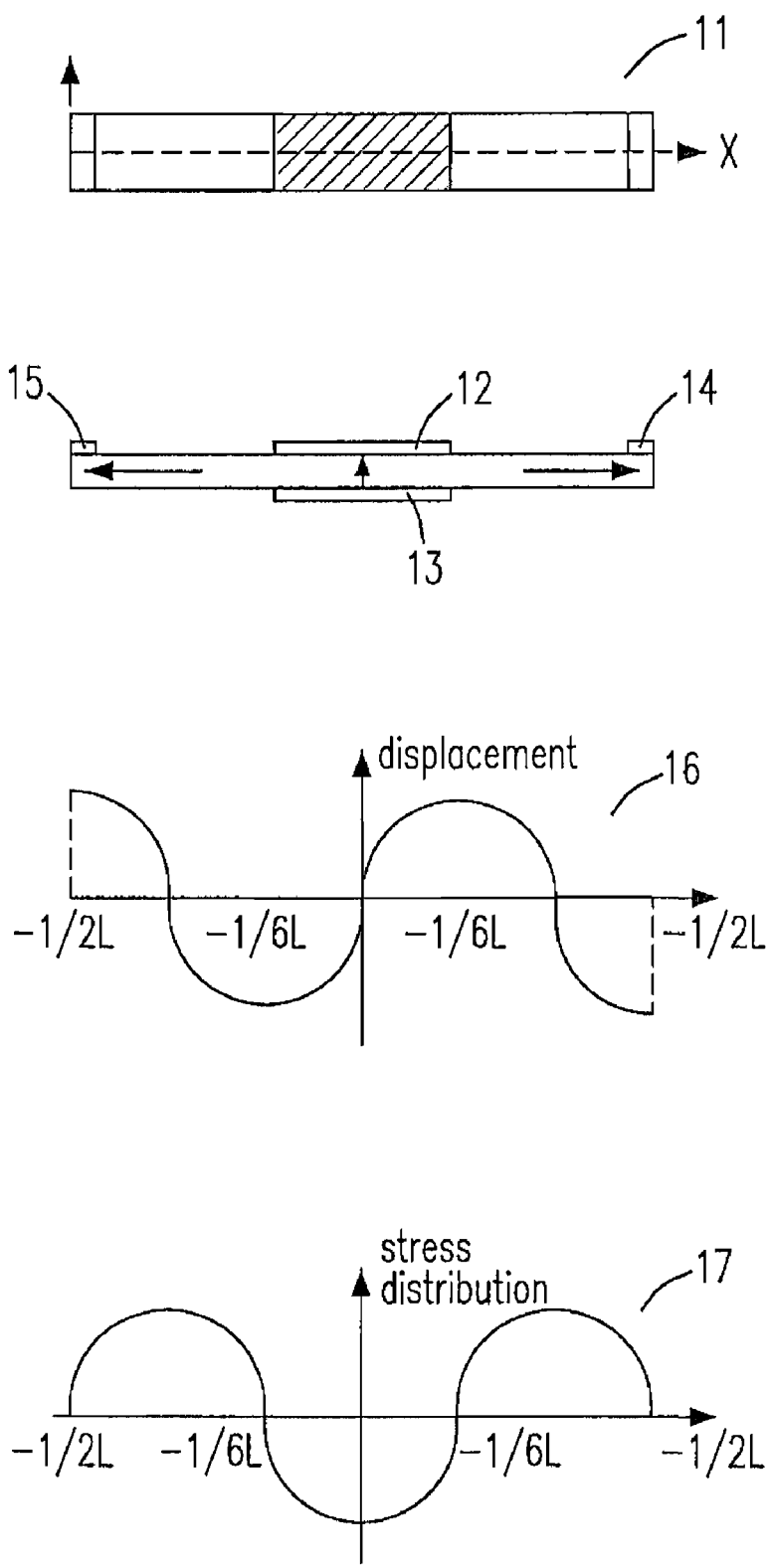
FIG. 1 is a diagram showing the piezoelectric transformer driven in a center and outputting on two sides thereof according to a preferred embodiment in the present invention.
Figure 2:
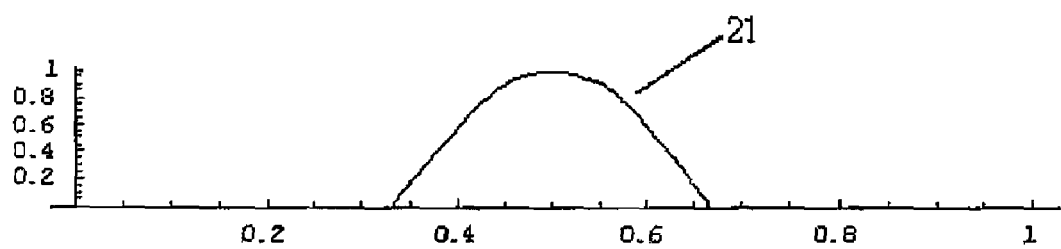
FIG. 2 is a diagram showing the design on input electrodes for filtering square waves.
Figure 3:
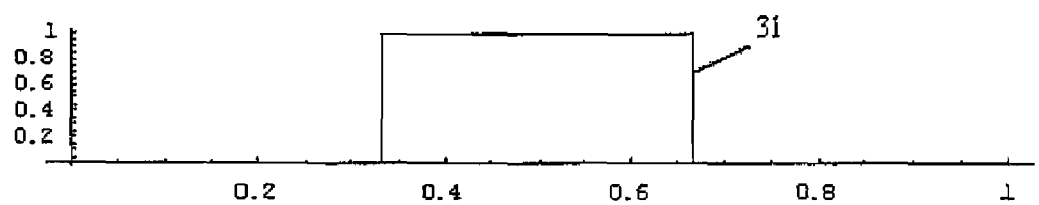
FIG. 3 is a diagram showing the design on the conventional piezoelectric transformer of uniform distribution.
Figure 4:
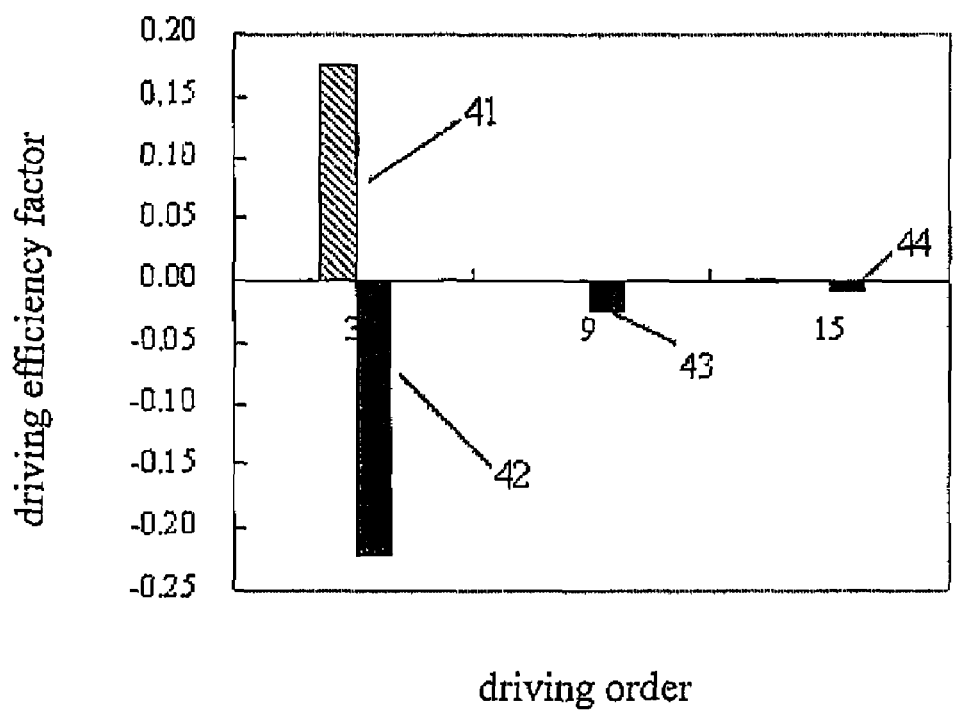
FIG. 4 is a diagram showing the driving efficiency factor on the modal driving electrodes of different modes in the present invention.

The present invention provides a series of multi-output piezoelectric transformers, and the first embodiment thereof is a dual-output piezoelectric transformer driven by a center thereof 11 as illustrated in FIG. 1. The piezoelectric transformer driven by a center thereof 11 is constituted by a piece of piezoelectric ceramic material. The central input terminal of the piezoelectric transformer 11 is polarized in a direction where the transformer is thickened, wherein the electrodes 12 and 13 are on a first side and a second side thereof, one and the other of which are connected for an input voltage and a reference voltage of the transformer 11 respectively. There are two output terminals on two ends of the piezoelectric transformer 11, wherein the two output terminals are polarized in reverse directions where the transformer is elongated, and output electrodes 14 and 15 are connected to two loads respectively. The measurements of the piezoelectric transformer driven by a center thereof 11 are a length of 53 mm by a width of 7.5 mm by a height of 2 mm, wherein the length of the input electrodes are one-third of the entire length of the piezoelectric transformer. Thus the frequency of the first order surface resonant vibration in the direction where the structure of the transformer is elongated is 32 kHz, and the frequency of the third order resonant vibration is 98 kHz, wherein the left side and the right side thereof manage to drive two cold cathode fluorescent lamps respectively.

The second embodiment of a dual-output modal piezoelectric transformer driven by a center thereof 162 is illustrated in FIG. 16. The dual-output modal piezoelectric transformer driven by a center thereof 162 is constituted by a elongated and thin piezoelectric ceramic, wherein the central input terminal thereof is polarized in a direction where the transformer is thickened, and the electrodes 16212 and 16213 for the input terminal on a front and a back thereof respectively have the configuration A(x) as follows:

$$A(x) = \sin\left(\frac{3\pi x}{L}\right)\left\{H\left[x - \frac{L}{3}\right] - H\left[x - \frac{2L}{3}\right]\right\} \quad (8)$$

Figure 16A:
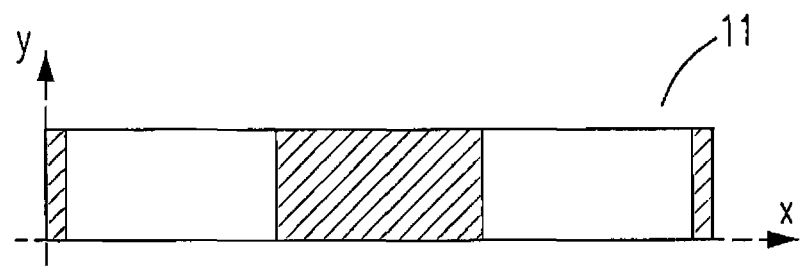
FIG. 16 is a diagram showing the piezoelectric transformer driven in a center and outputting on two sides thereof with (a) conventional input electrodes distributed uniformly, (b) novel modal input electrodes, and (c)-(d) novel modal electrodes symmetric in respect of the x and y directions according to a preferred embodiment in the present invention.
Figure 16B:
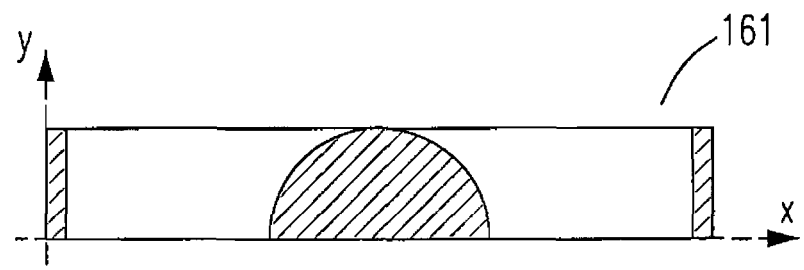
Figure 16C:
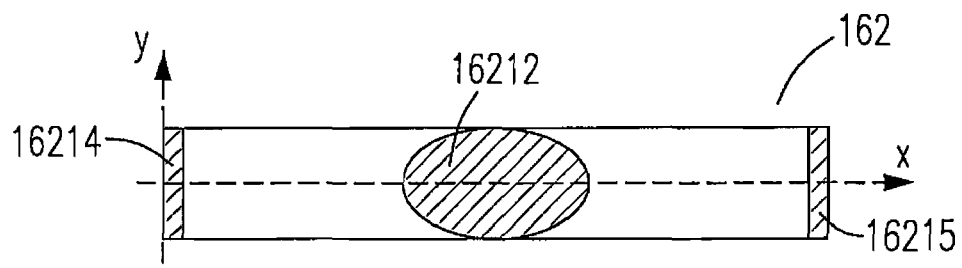
Figure 16D:
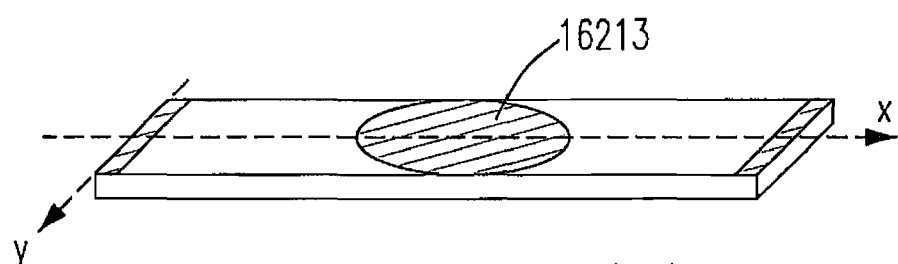
Figure 17A:
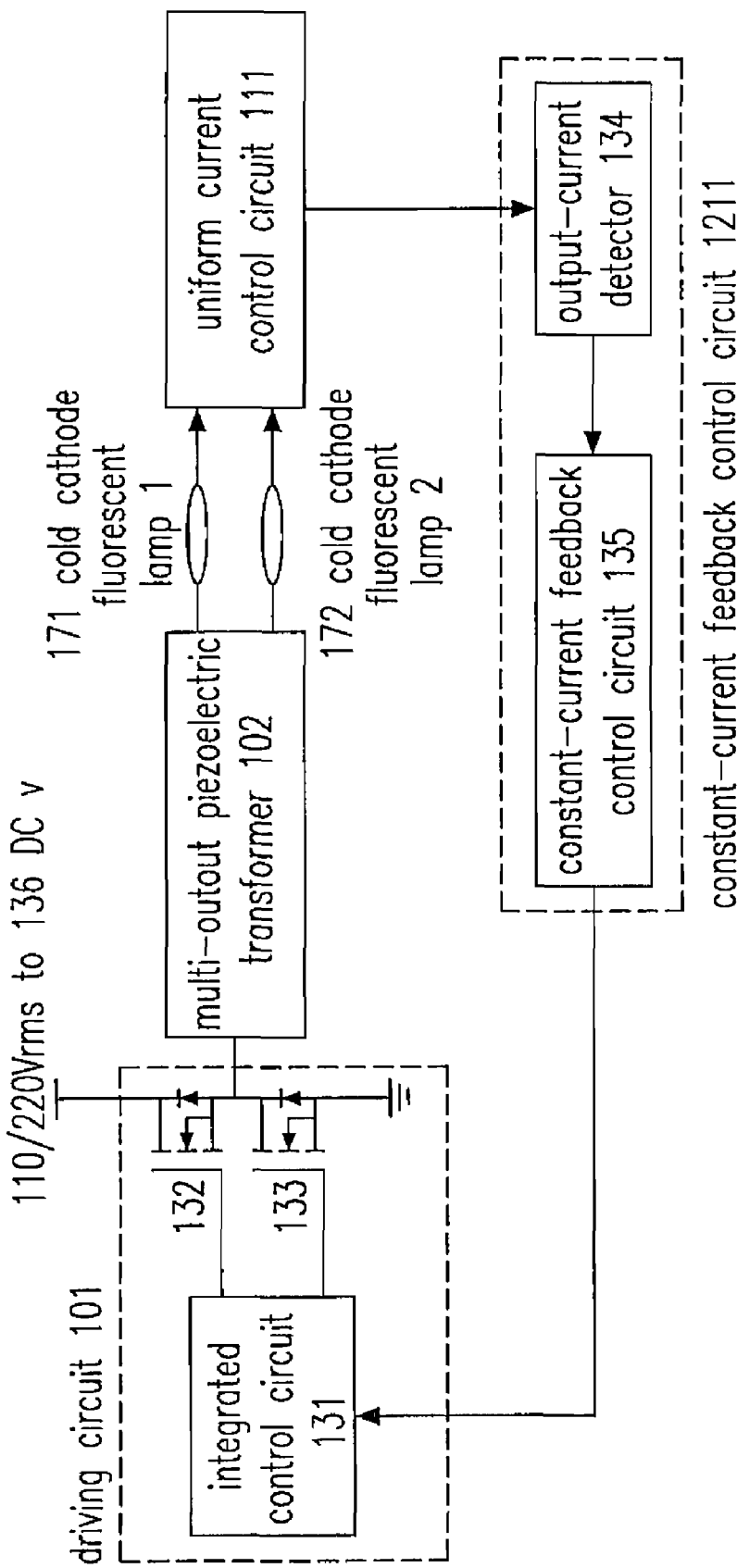
FIG. 17 is a diagram showing the dual-output piezoelectric transformer for driving the two cold cathode fluorescent lamps through (a) constant-current feedback control and (b) constant-phase difference feedback control according to a preferred embodiment in the present invention.
Figure 17B:
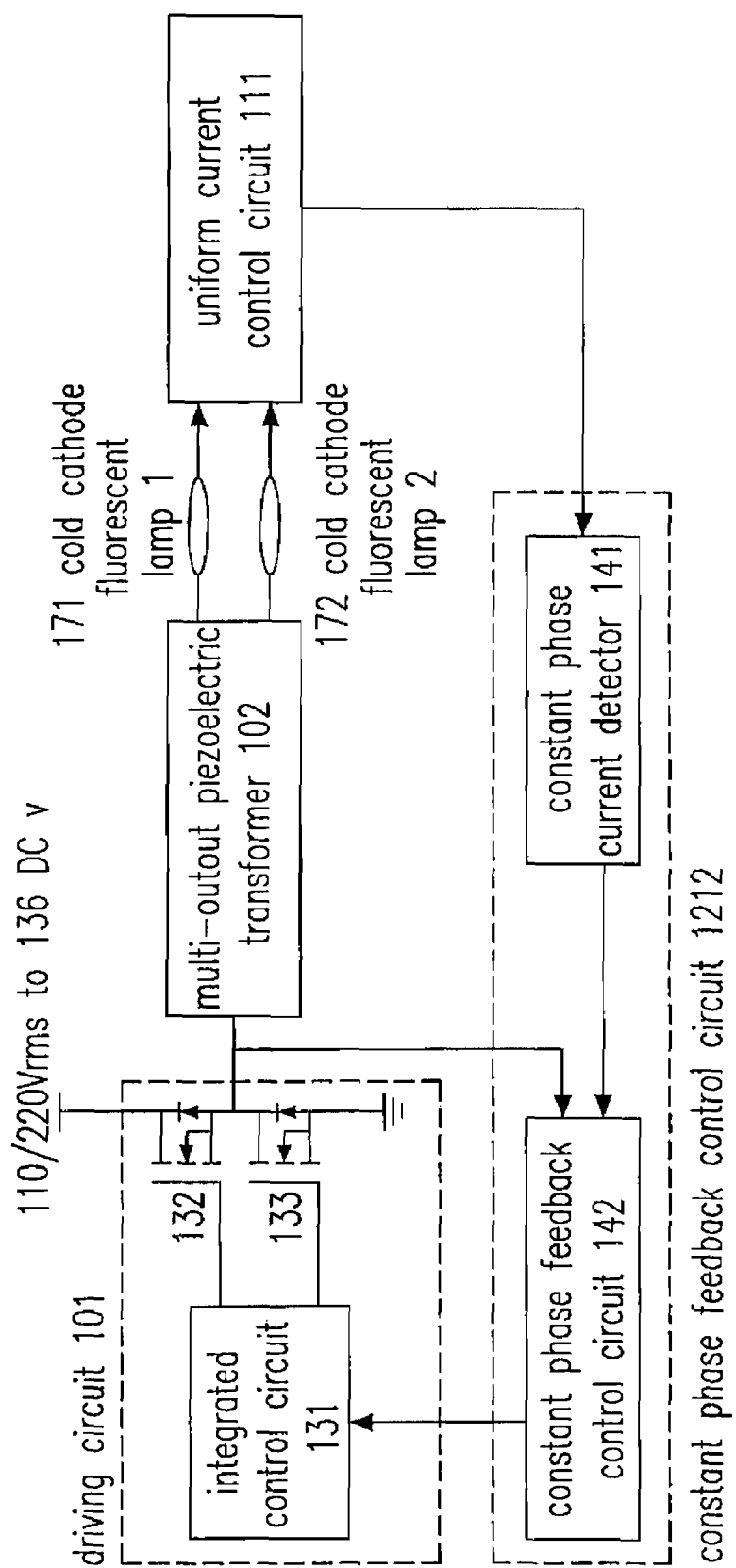
Figure 18A:
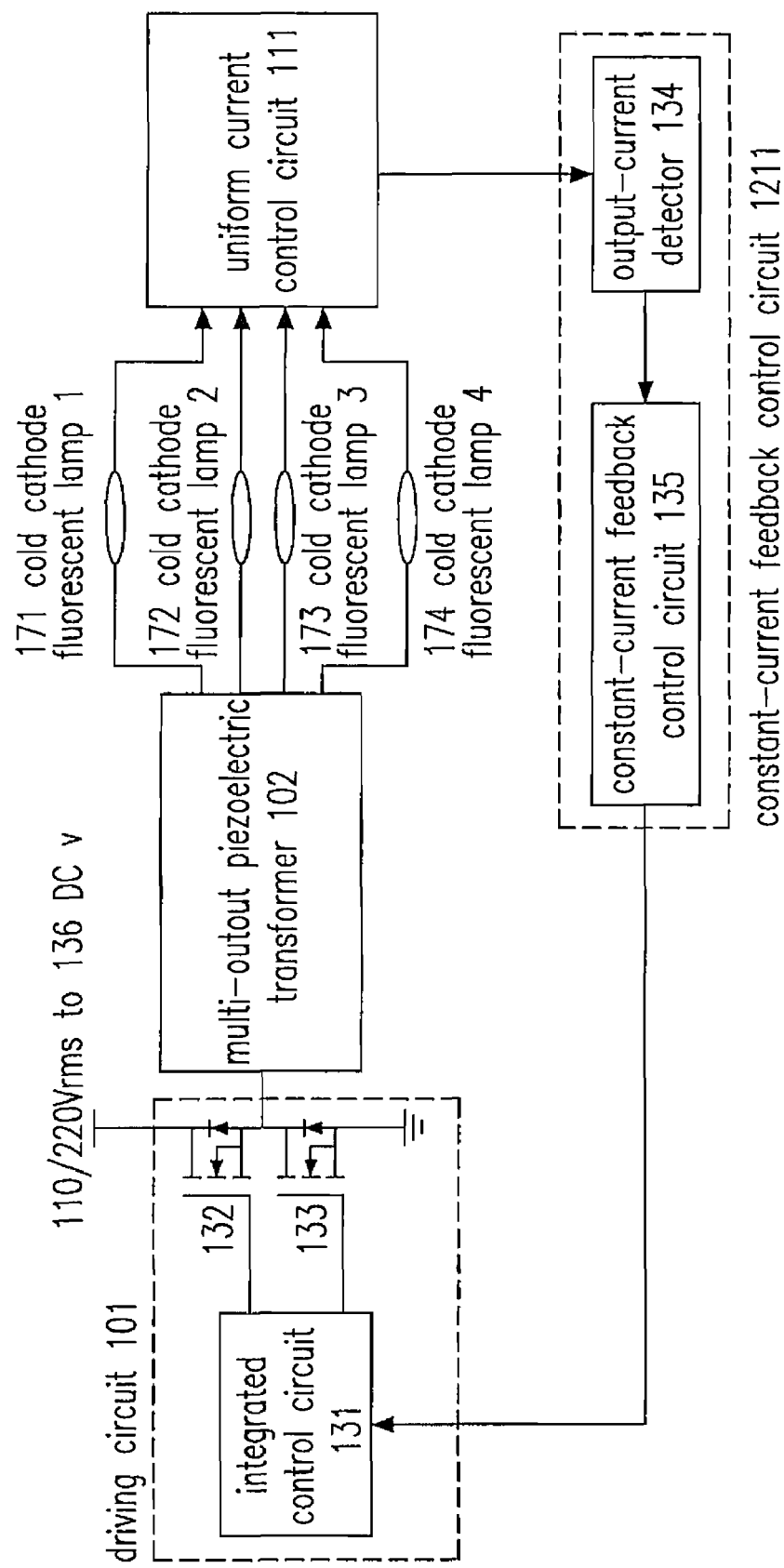
FIG. 18 is a diagram showing the quadri-output piezoelectric transformer for driving the four cold cathode fluorescent lamps through (a) constant-current feedback control and (b) constant-phase difference feedback control according to a preferred embodiment in the present invention.
Figure 18B:
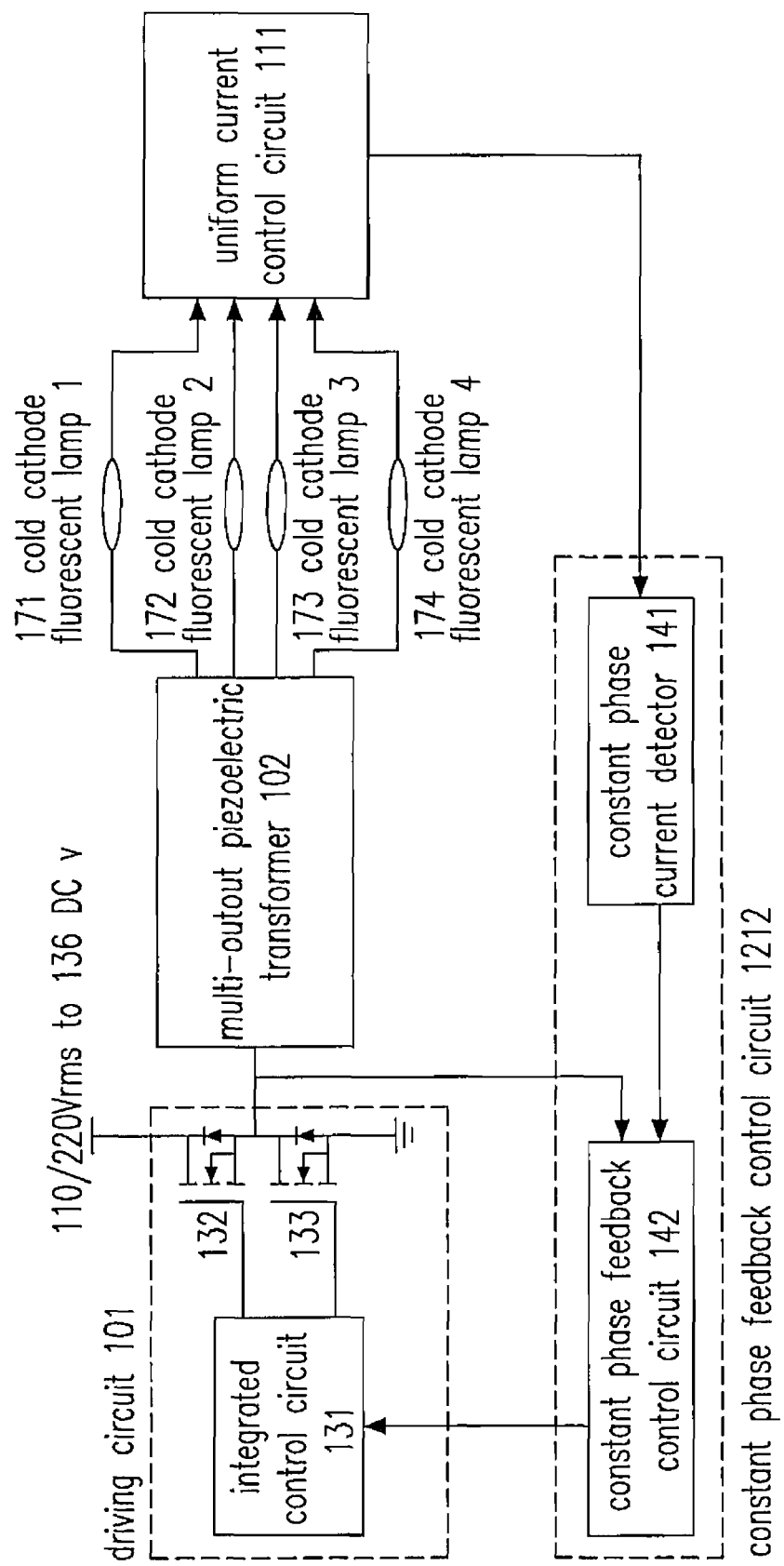

L is the length of the length of the modal piezoelectric transformer driven in a center thereof 162, and one of the electrodes 16212 and 16213 in FIGS. 16(c) and (d) is connected for an input voltage, and the other is connected for a reference voltage thereof. There are two output terminals on two ends of the modal piezoelectric transformer driven in a center thereof 162, wherein the two output terminals are polarized in reverse directions where the transformer is elongated, and output electrodes 16215 and 16214 thereof are connected to two loads respectively. The measurements of the modal piezoelectric transformer driven in a center thereof 162 are 53 mm by 7.5 mm by 2 mm, where in the length thereof is 53 mm, the frequency of the first order surface resonant vibration in the direction where the structure of the transformer is elongated is 32 kHz, and the third resonant frequency thereof is 98 kHz where the piezoelectric transformer operates.

FIG. 16(a) illustrates the electrode configurations 11 of the conventional uniformly distributed piezoelectric transformer, whereas FIG. 16(b) illustrates the configurations of the centrally driving electrodes for a dual-output piezoelectric transformer 161, which are configured as the formula (8) in respect of a design principle of modal electrodes, wherein modulation of weight of the y direction are adjusted along the x direction. FIG. 16(c) illustrates another modal electrode, wherein the configurations thereof are distributed in accordance with weight thereof according to the corresponding mode configurations along the x direction in comparison with the electrodes designed to be symmetric in respect of the x direction in FIG. (b).

The third embodiment of the multi-output piezoelectric transformer provided in the present invention is a disk-shaped multi-output piezoelectric transformer comprising a circular piezoelectric ceramic disk, wherein the input terminal is positioned in a central area thereof, and the input electrodes are positioned on a first side and a second side thereof and polarized in a direction where the transformer is thickened. The output terminals for the disk-shaped multi-output piezoelectric transformer are distributed according to the number of the output terminals around the circular piezoelectric ceramic disk, wherein each of the output terminals have a generally half-circular electrode configuration. All the output terminals are designed in the same way, and the electrodes thereof are mounted around surfaces of diametrically opposite positions of the disk, wherein the output terminals are polarized in radial directions with respect to the output electrodes as centers.

Since the output terminals of the disk-shaped multi-output piezoelectric transformer are designed to be symmetric, the effects of the loads on the step-ups thereof are reduced for further addressing the lighting problem of the disk-shaped multi-output piezoelectric transformer applied to multiple lamps.

Figure 5:
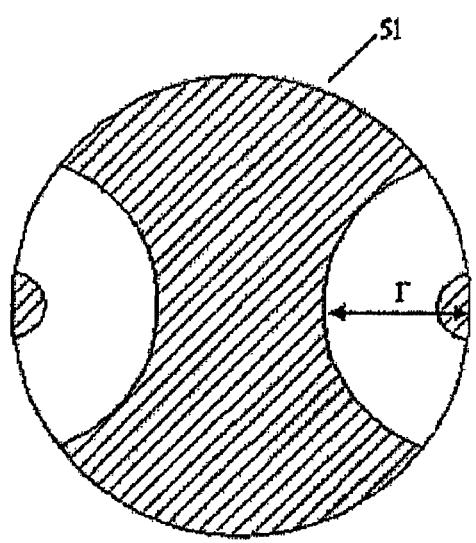
FIGS. 5(a) and (b) are diagrams respectively showing the designs on the disk-shaped dual-output piezoelectric transformer for the distribution of the surface electrode configurations and the directions of polarization of the piezoelectric transformer in the present invention.
Figure 5:
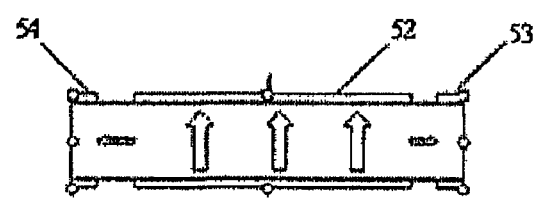

FIG. 5(a) illustrates a disk-shaped dual-output piezoelectric transformer 51, wherein the input terminal is positioned in a central area thereof, and the electrodes 52 of the input terminal configured as biaxial symmetry and positioned on a front and a back are polarized in a direction where the transformer is thickened. Two output terminals with the electrodes 53 and 54 of the disk-shaped dual-output piezoelectric transformer 51 are respectively mounted around surfaces of two diametrically opposite positions of the disk and have generally half-circular electrode configurations, and further the output terminals are polarized in radial directions in respect of the output electrodes 53 and 54 as centers. For authentication of the operation characteristics of the disk-shaped piezoelectric transformer 51, a finite element software is introduced for analyzing the distribution of surface voltage thereof in a resonant vibration state. The design measurements of the disk-shaped piezoelectric transformer are 28 mm in diameter and 2 mm in thickness respectively, and the two output terminals thereof are distributed on two sides thereof symmetrically, wherein the two output terminals are arc areas with centers on the edge of the disk. The output terminals of the arc areas has an intermediate length of 9 mm, and the characteristics of the piezoelectric material (PZT4) coefficients for simulation are provided herein, wherein the elastic coefficient matrix thereof is as follows:

$$\begin{bmatrix} 115.4 & 74.28 & 74.28 & 0 & 0 & 0 \\ 74.28 & 139.0 & 77.84 & 0 & 0 & 0 \\ 74.28 & 77.84 & 139.0 & 0 & 0 & 0 \\ 0 & 0 & 0 & 25.64 & 0 & 0 \\ 0 & 0 & 0 & 0 & 25.64 & 0 \\ 0 & 0 & 0 & 0 & 0 & 25.64 \end{bmatrix} GPa; \quad (14)$$

the force to electricity transformation matrix is as follows:

$$\begin{bmatrix} 15.08 & 0 & 0 \\ -5.207 & 0 & 0 \\ -5.207 & 0 & 0 \\ 0 & 12.710 & 0 \\ 0 & 0 & 12.710 \\ 0 & 0 & 0 \end{bmatrix} Coulomb/m^2; \quad (15)$$

the dielectric constant matrix thereof is as follows:

$$\begin{bmatrix} 5.872 & 0 & 0 \\ 0 & 6.752 & 0 \\ 0 & 0 & 6.752 \end{bmatrix} 10^{-9} \, farad/m, \quad (16)$$

and the density of the piezoelectric material is 7500 kg/m³.

Figure 6:
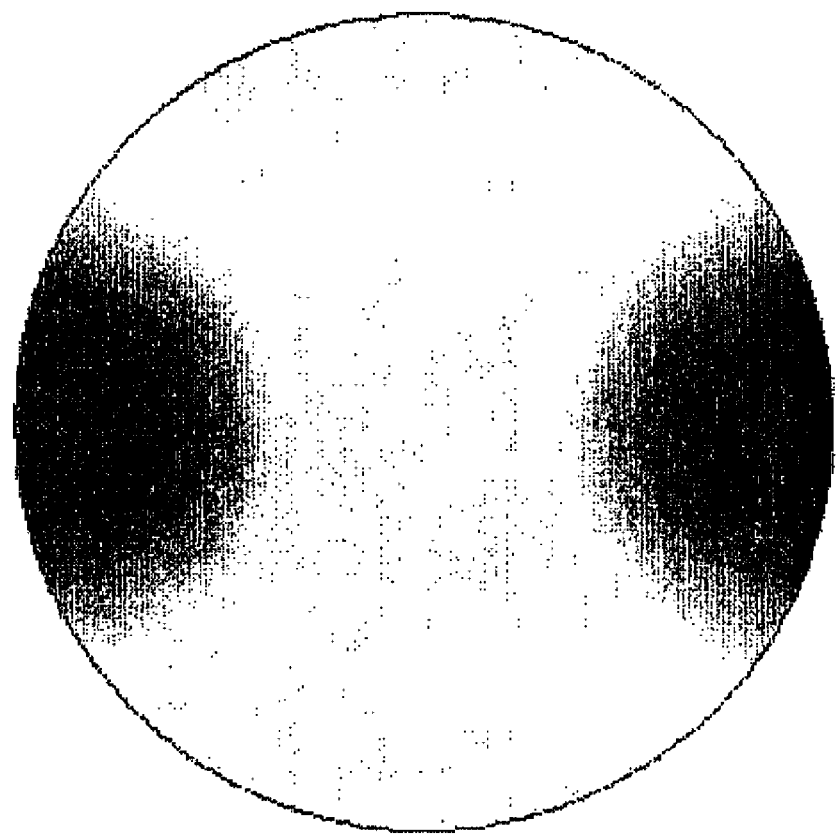
FIG. 6 is a diagram showing the analysis of the resonant vibration voltage of the disk-shaped dual-output piezoelectric transformer in the present invention.

The decided operation mode is the first mode of the surface vibration, and the operation frequency by the simulation is 79.9 kHz. FIG. 6 illustrates the entire voltage distribution state of the disk-shaped piezoelectric transformer 51 with an input voltage of 10V and the two output terminals are of open loops. In view of FIG. 5, there is local distribution of high voltage around the two output terminals, wherein the determined output voltage is 1398V, and the step-up is 140 times the magnitude thereof. It is derived that the disk-shaped piezoelectric transformer bears a symmetric structure and higher piezoelectric coefficients for force to electricity transformation.

Figure 7:
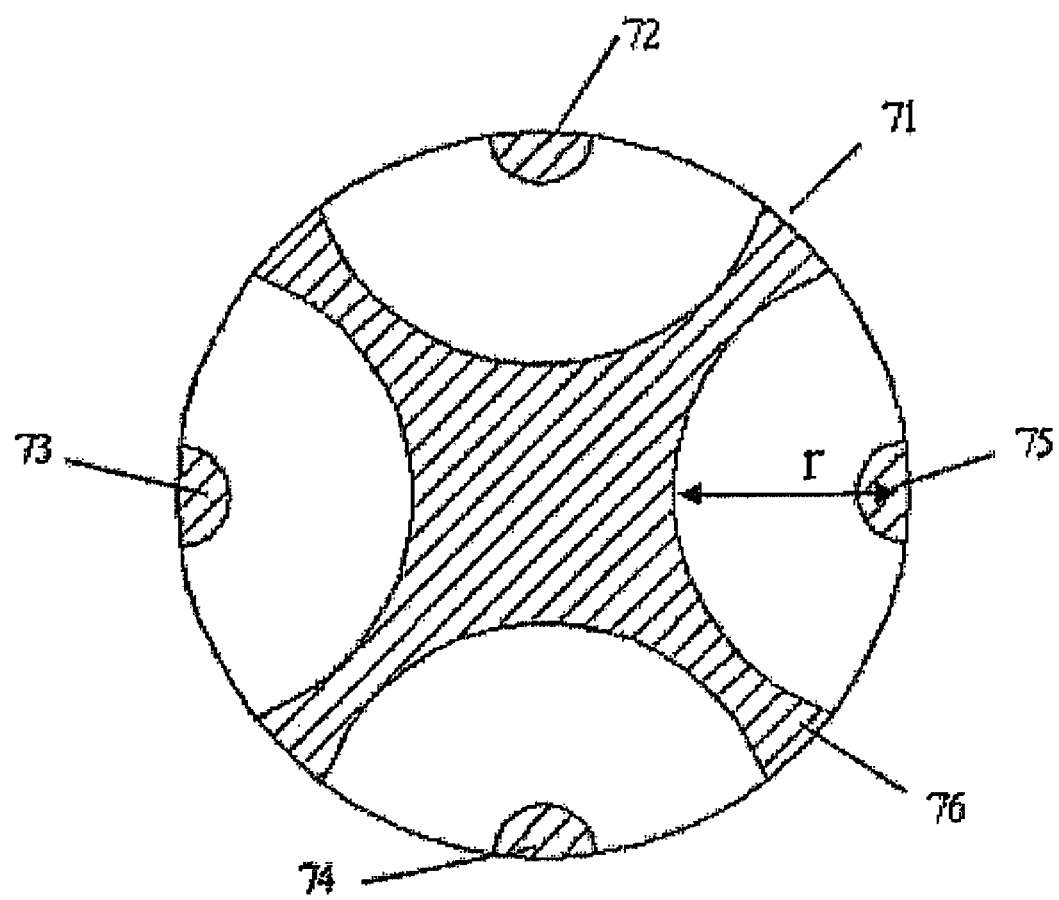
FIG. 7 is a diagram showing the design on the disk-shaped quadric-output piezoelectric transformer in the present invention.

FIG. 7 illustrates a quadric-output piezoelectric transformer 71 as a demonstration for a quadruple-output piezoelectric transformer, wherein the input terminal is positioned in a central area thereof, and the biaxially symmetric electrodes 76 of the input terminal are positioned on a front and a back of the transformer and polarized in a direction where the transformer is thickened. There are four output terminals of the quadric-output piezoelectric transformer 71 positioned in four equal positions thereof and approximately configured as crescents, wherein the electrodes 72, 73, 74 and 75 of the output terminals positioned at the edge of the quadric-output piezoelectric transformer 71, and the output terminals are polarized in radial directions in respect of output electrodes 72, 73, 74 and 75 as centers.

Figure 8:
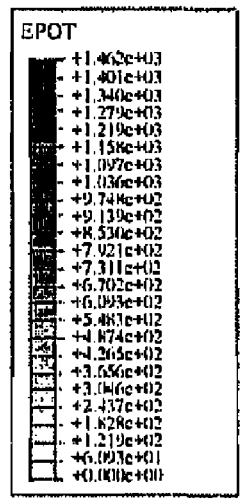
FIG. 8 is a diagram showing the simulation on the distribution of the resonant vibration voltage of the disk-shaped dual-output piezoelectric transformer with a frequency of 73.5 kHz in the present invention.
Figure 8:
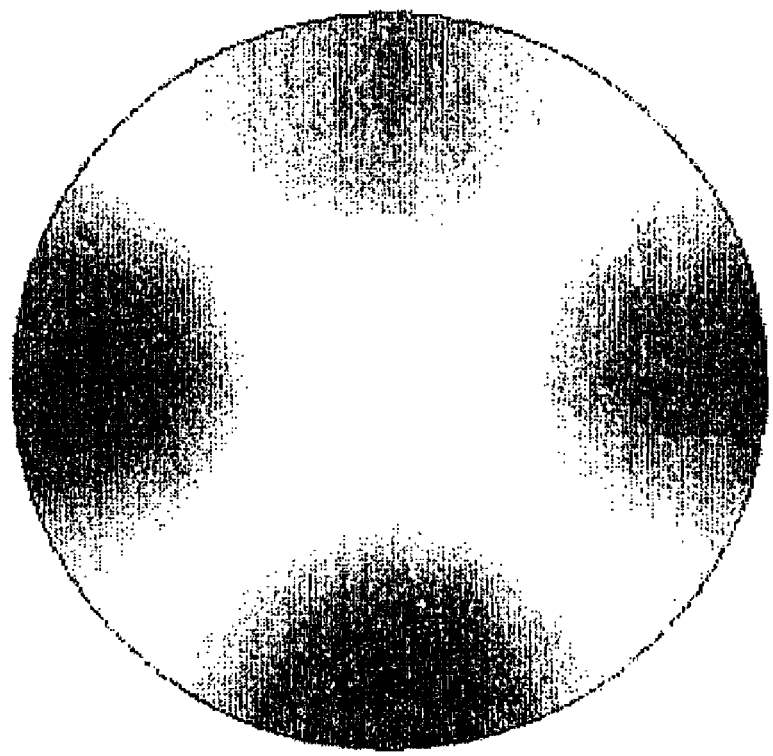

To utilize the finite element software to analyze the distribution of high voltage, the characteristics of the piezoelectric materials therefor are represented by the formulae (14), (15) and (16), wherein the measurements of the piezoelectric transformer are a diameter of 28 mm and a thickness of 2 mm. FIG. 7 illustrates four output terminals therefor, which are four arc areas with an intermediate length, r, of 9 mm having centers on edges of the disk. Based on the simulation of the voltage distribution, wherein the input voltage is 10V and the output terminals are open loops for the quadric-output piezoelectric transformer 71, it is demonstrated that the quadric-output piezoelectric transformer 71 operates with high step-ups around two driving frequencies, 84.7 kHz and 100.3 kHz, respectively. FIG. 8 illustrates the voltage distribution of the quadric-output piezoelectric transformer 71 with a resonant frequency of 84.7 kHz, wherein a surface vibration with co-contraction and co-expansion dominates for the mode of 84.7 kHz and the mode of the symmetric outputs identical thereto, and the maximal output voltage is 1462 V with a step-up 150 times the magnitude thereof.

Figure 9:
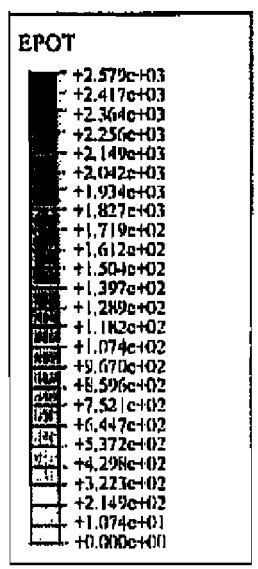
FIG. 9 is a diagram showing another simulation on the distribution of the resonant vibration voltage of the disk-shaped dual-output piezoelectric transformer with a frequency of 100 kHz in the present invention.
Figure 9:
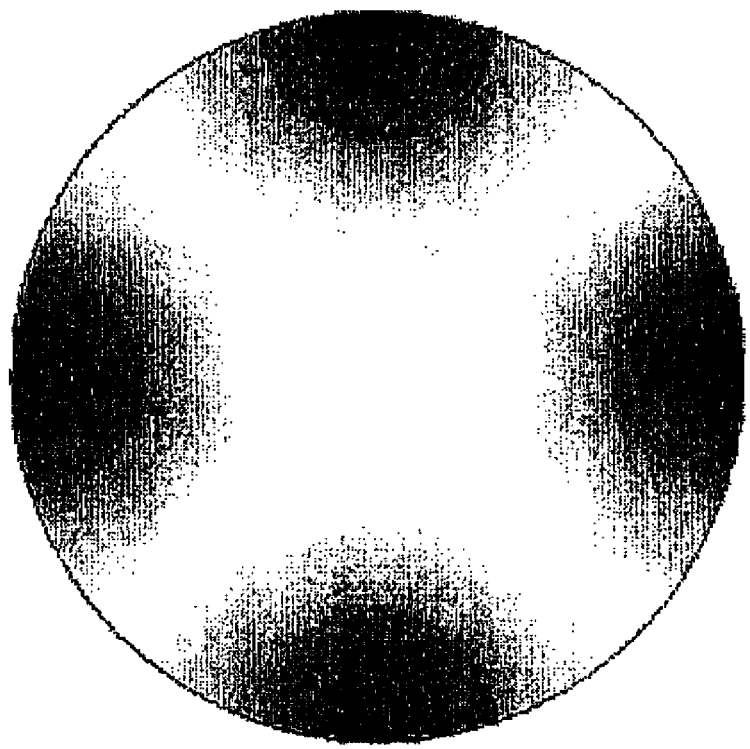
Figure 10A:
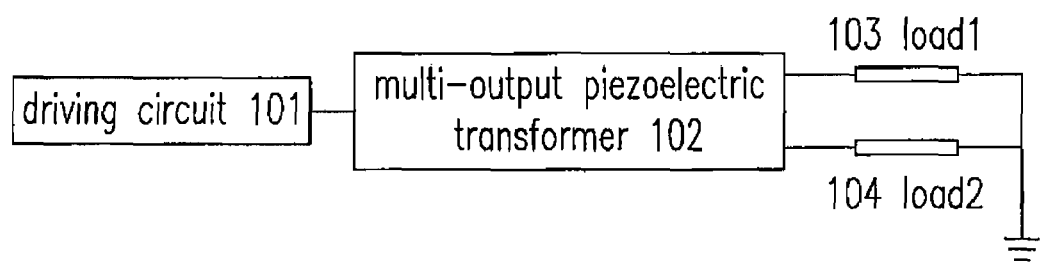
FIG. 10 is a diagram showing the design on the driving circuit of the multi-output piezoelectric transformer with (a) two loads of impedance and (b) four loads of impedance the present invention.
Figure 10B:
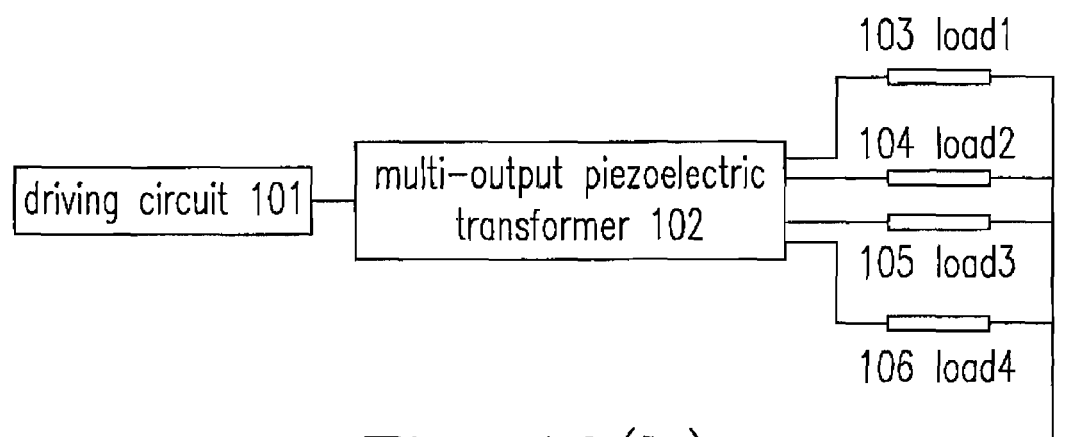
Figure 12A:
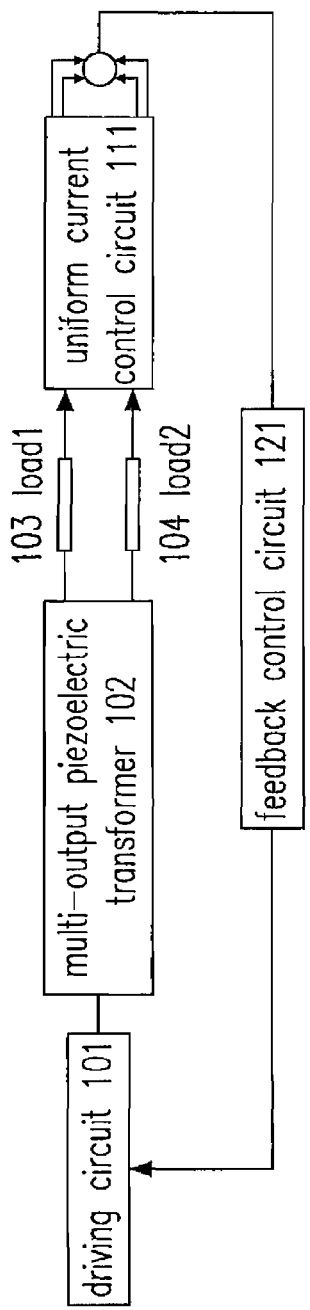
FIG. 12 is a diagram showing the driving circuit including the feedback control circuit of the multi-output piezoelectric transformer for (a) two loads of impedance and (b) four loads of impedance in the present invention.
Figure 12B:
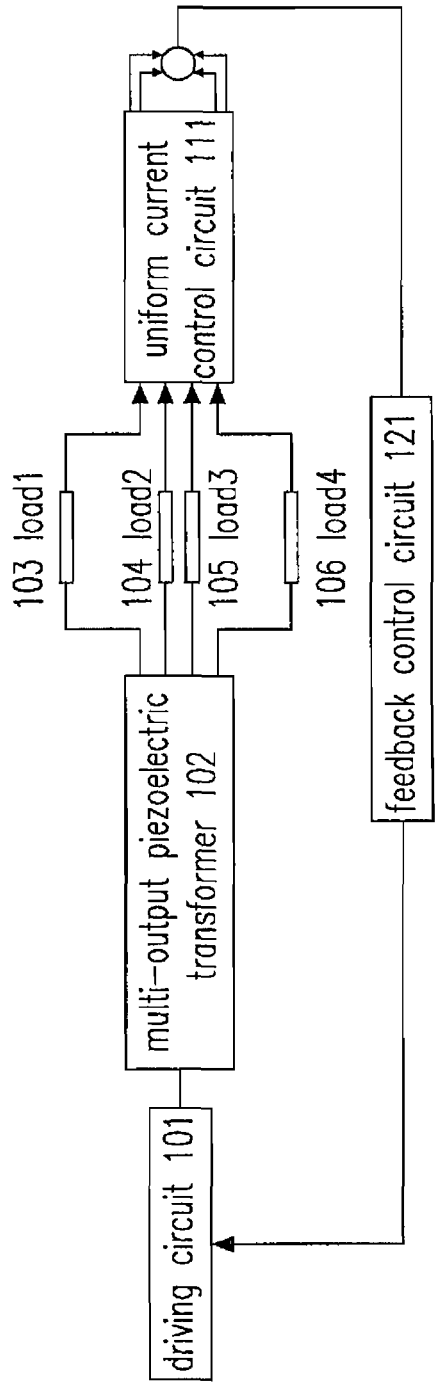
Figure 13A:
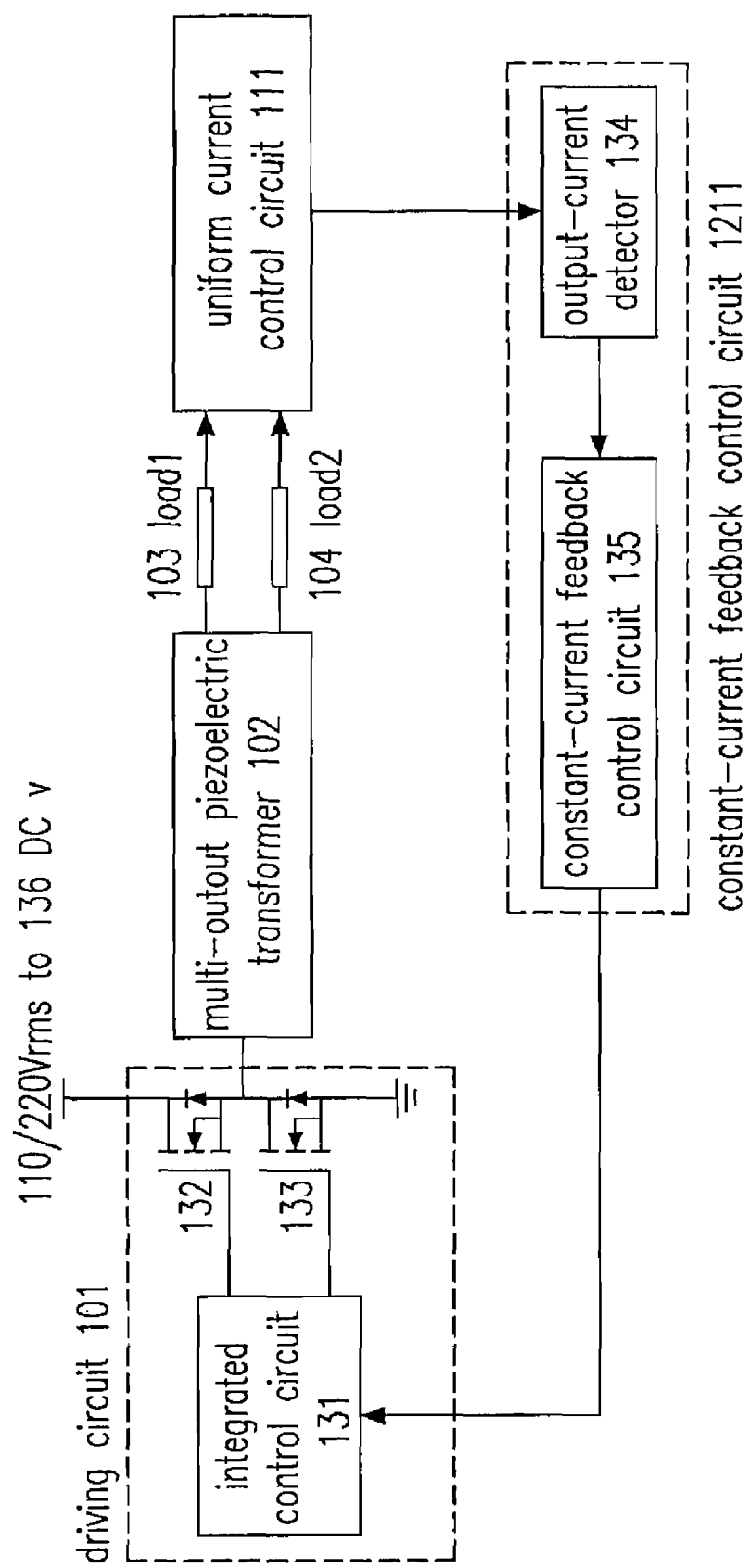
FIG. 13 is a diagram showing the driving circuit including the constant-current feedback control circuit of the multi-output piezoelectric transformer for (a) two loads of impedance and (b) four loads of impedance in the present invention.
Figure 13B:
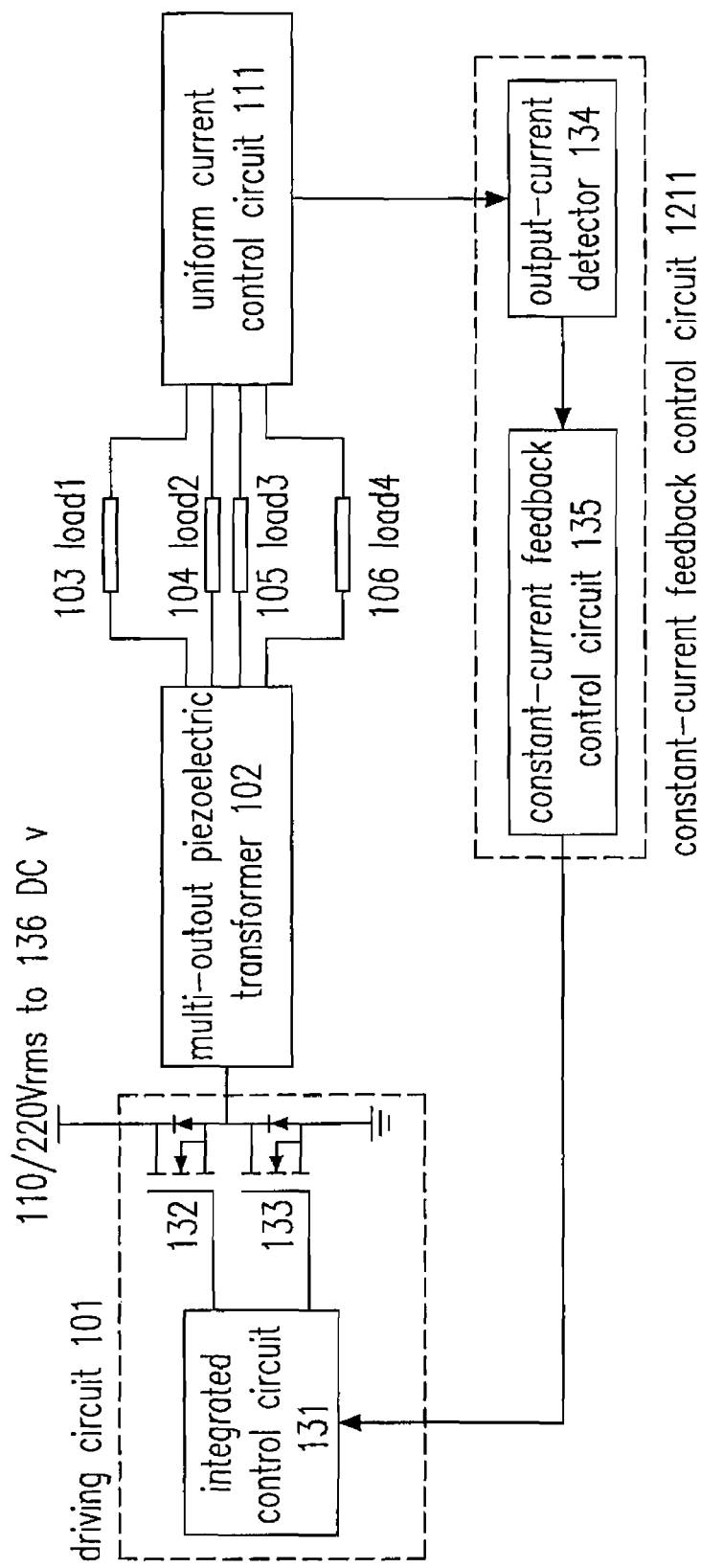
Figure 14A:
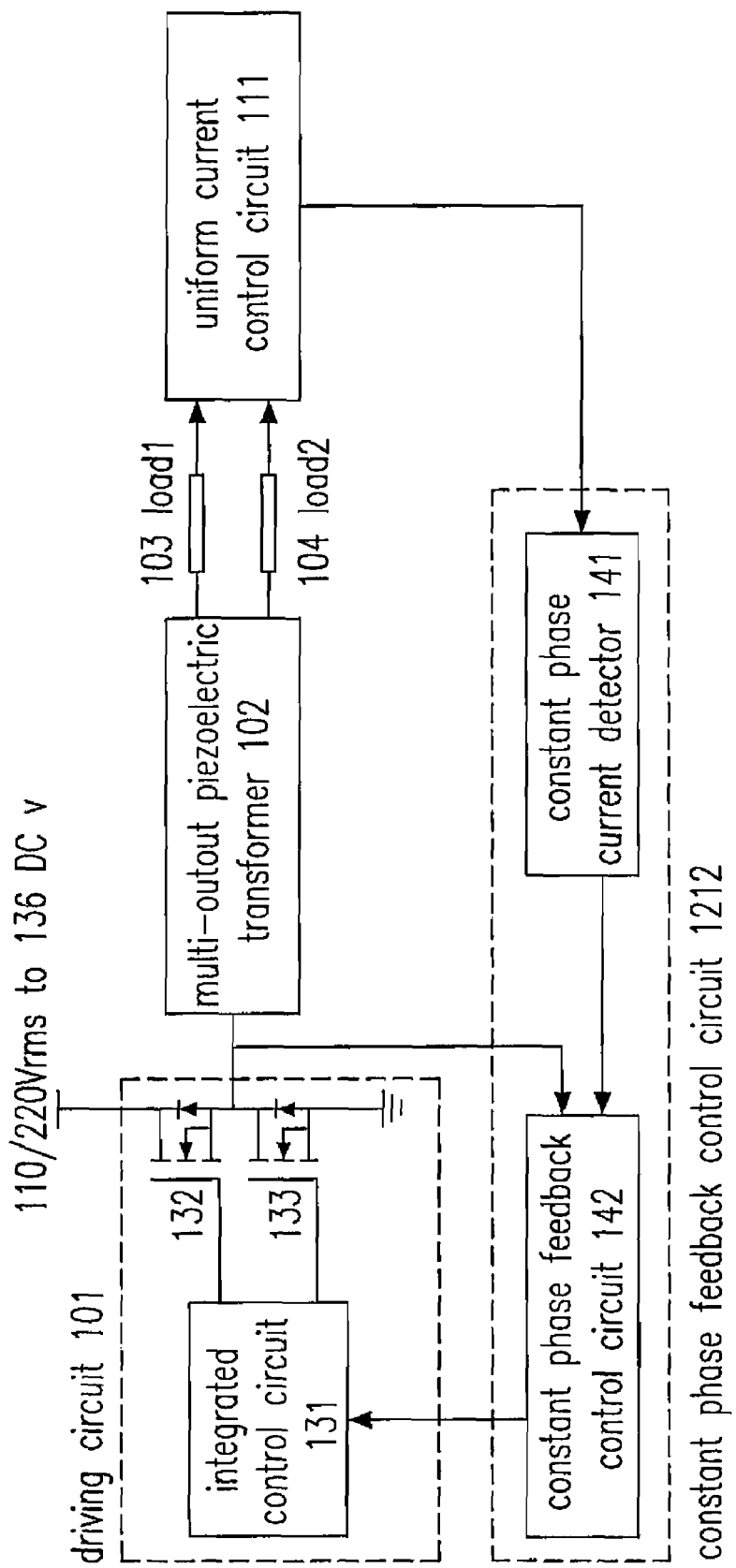
FIG. 14 is a diagram showing the driving circuit including the fixing-phase feedback control circuit of the multi-output piezoelectric transformer for (a) two loads of impedance and (b) four loads of impedance in the present invention.
Figure 14B:
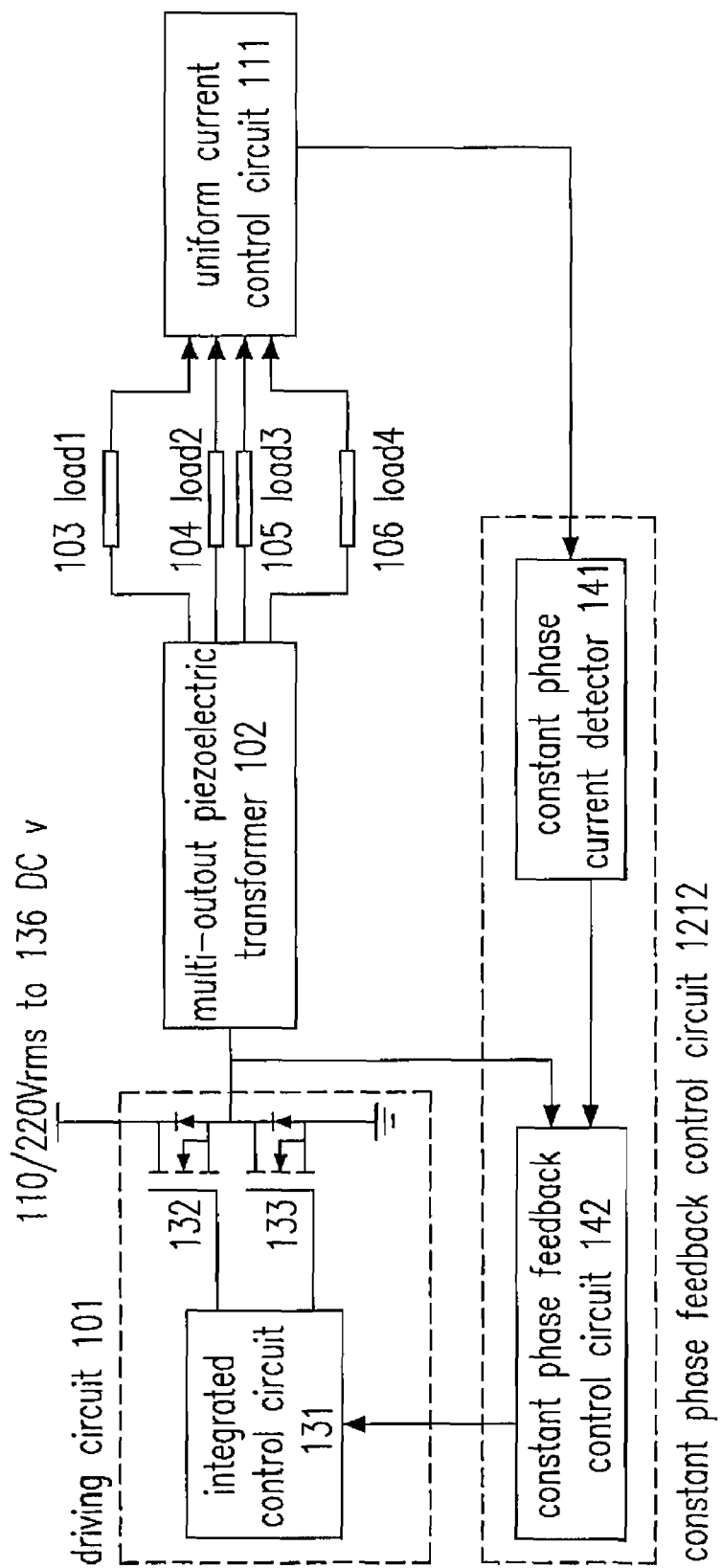
Figure 21:
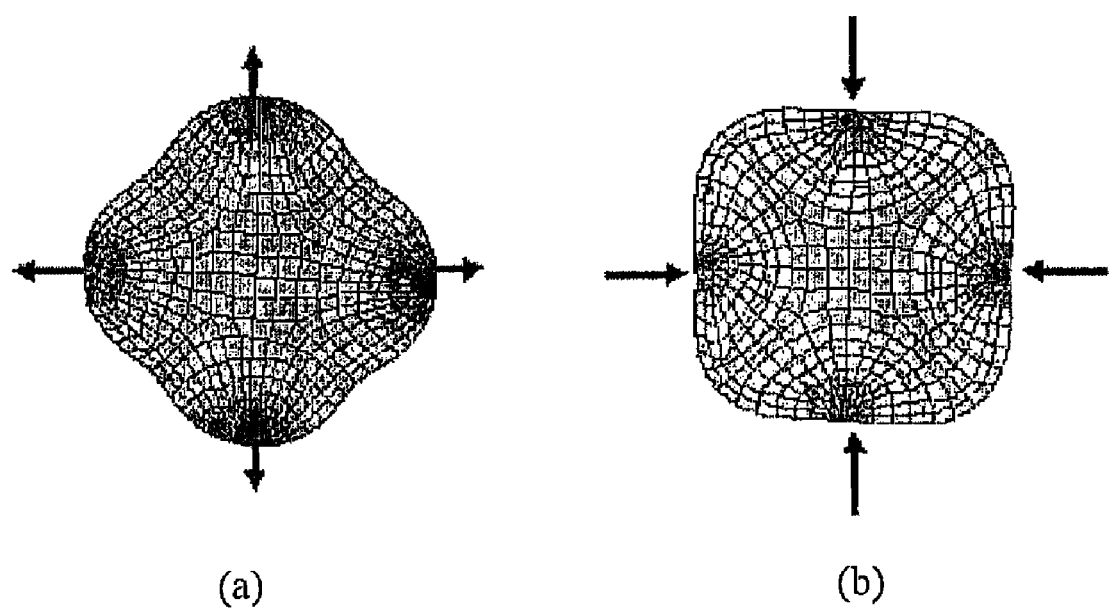
FIGS. 21(a) and (b) are diagrams showing configurations of the resonant vibrations at the frequency of 100.3 kHz for the disk-shaped quadric-output piezoelectric transformer in the present invention.

FIG. 9 illustrates the high voltage distribution of the quadric-output piezoelectric transformer 71 around a resonant frequency of 100 kHz in the same condition as the abovementioned, wherein the highest output voltage is 257.9V, and the step-up is approximately 25 times the magnitude thereof. FIG. 21 illustrates vibration configurations of the resonant vibration, wherein the arrows in FIG. 21(*a*) denote the directions where the quadric-output piezoelectric transformer 71 expands and the positions where four high voltages thereof concentrates respectively. FIG. 21(*b*) denotes a contraction state of the piezoelectric transformer, wherein there are four different concentration areas of high voltage in view of the voltage distribution thereof as well for application to drive four different loads of impedance simultaneously.

Figure 15:
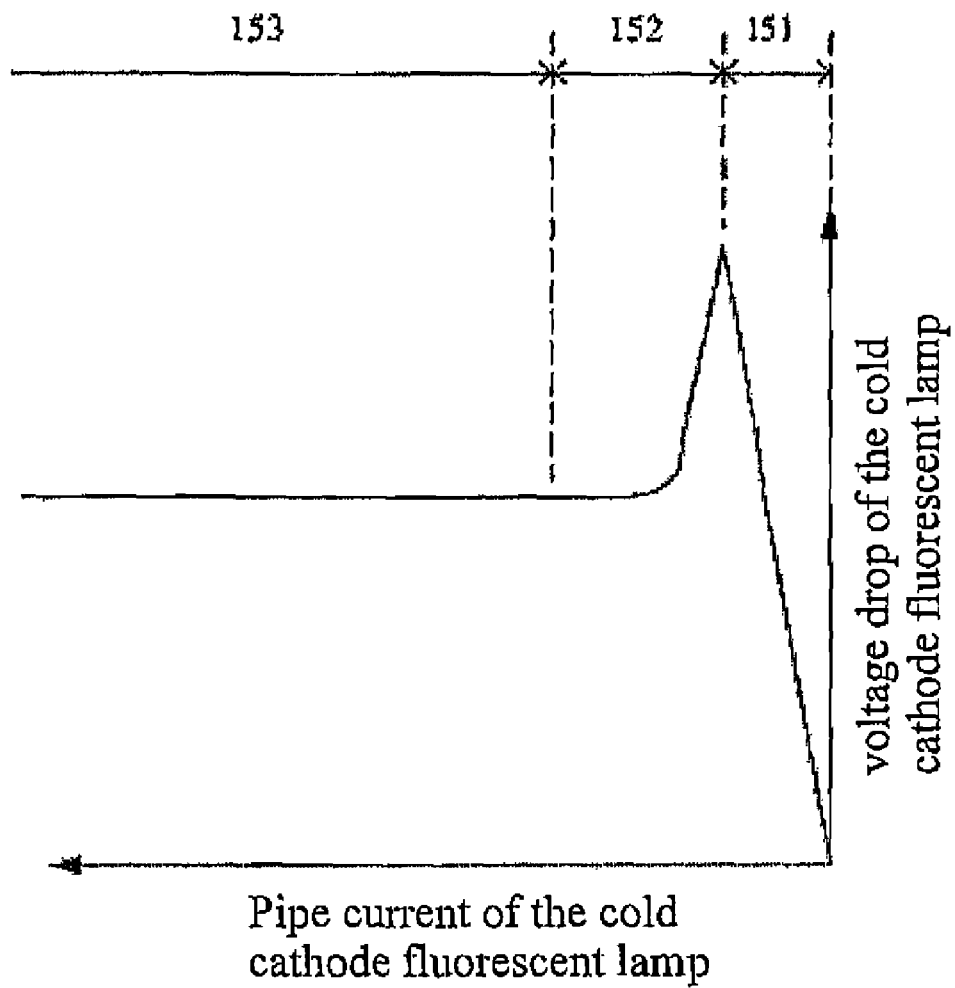
FIG. 15 is a diagram showing the operation characteristics of the cold cathode fluorescent lamps in the present invention.

The present invention provides a multi-output piezoelectric transformer for a multi-output piezoelectric inverter to drive multiple cold cathode fluorescent lamps simultaneously, and lower the cost for back light module effectively, wherein the characteristics before lighting 151, the spontaneous characteristics after lighting 152 and the stable lighting characteristics 153 of the lamps are illustrated in FIG. 15. The embodiment of the multi-output piezoelectric inverter in the present invention is described as follows.

Figure 19A:
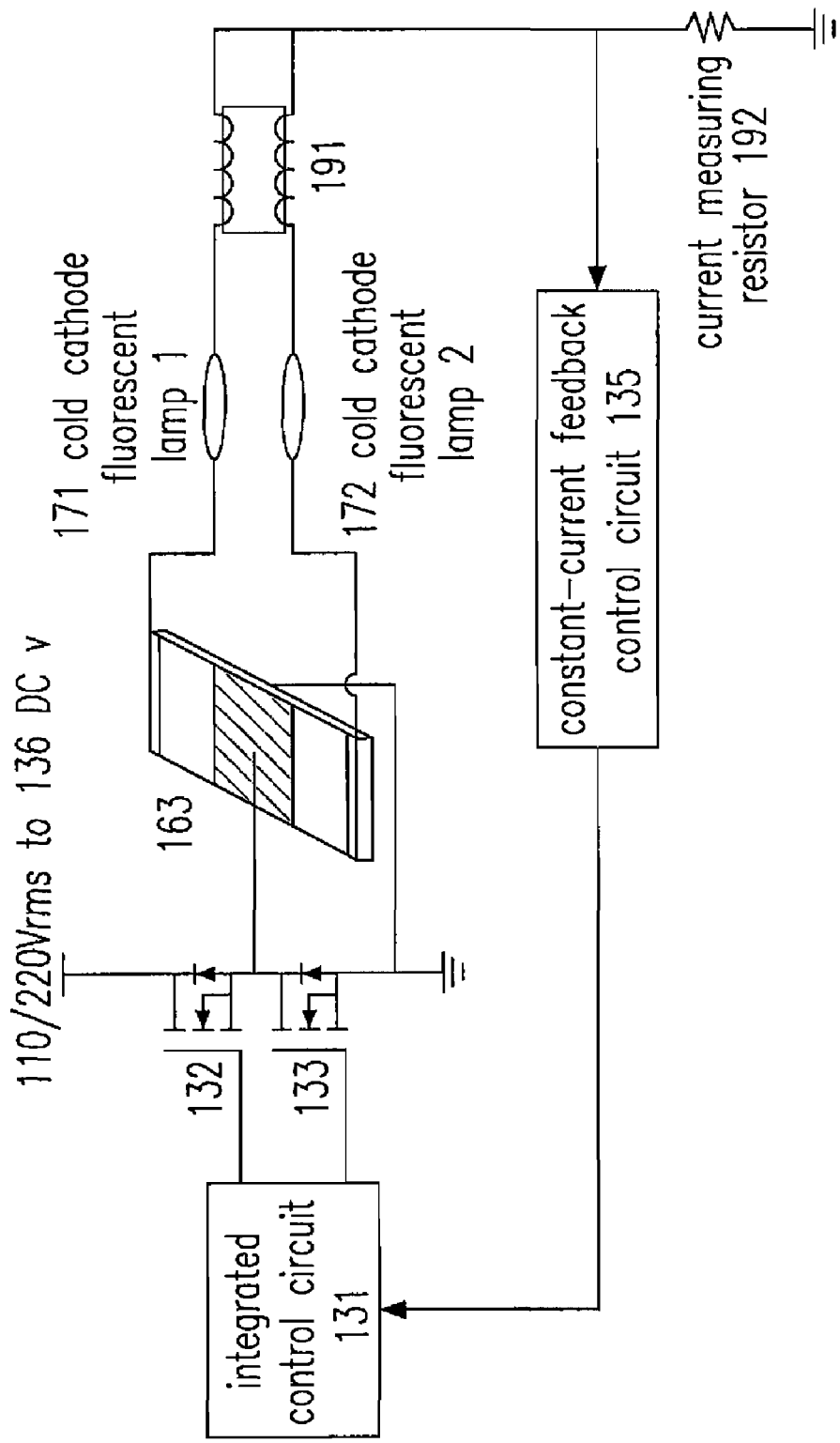
FIG. 19 is a diagram showing the piezoelectric transformer driven in a center thereof for driving two cold cathode fluorescent lamps through (a) constant-current feedback control and (b) constant-phase difference feedback control according to a preferred embodiment in the present invention.
Figure 19B:
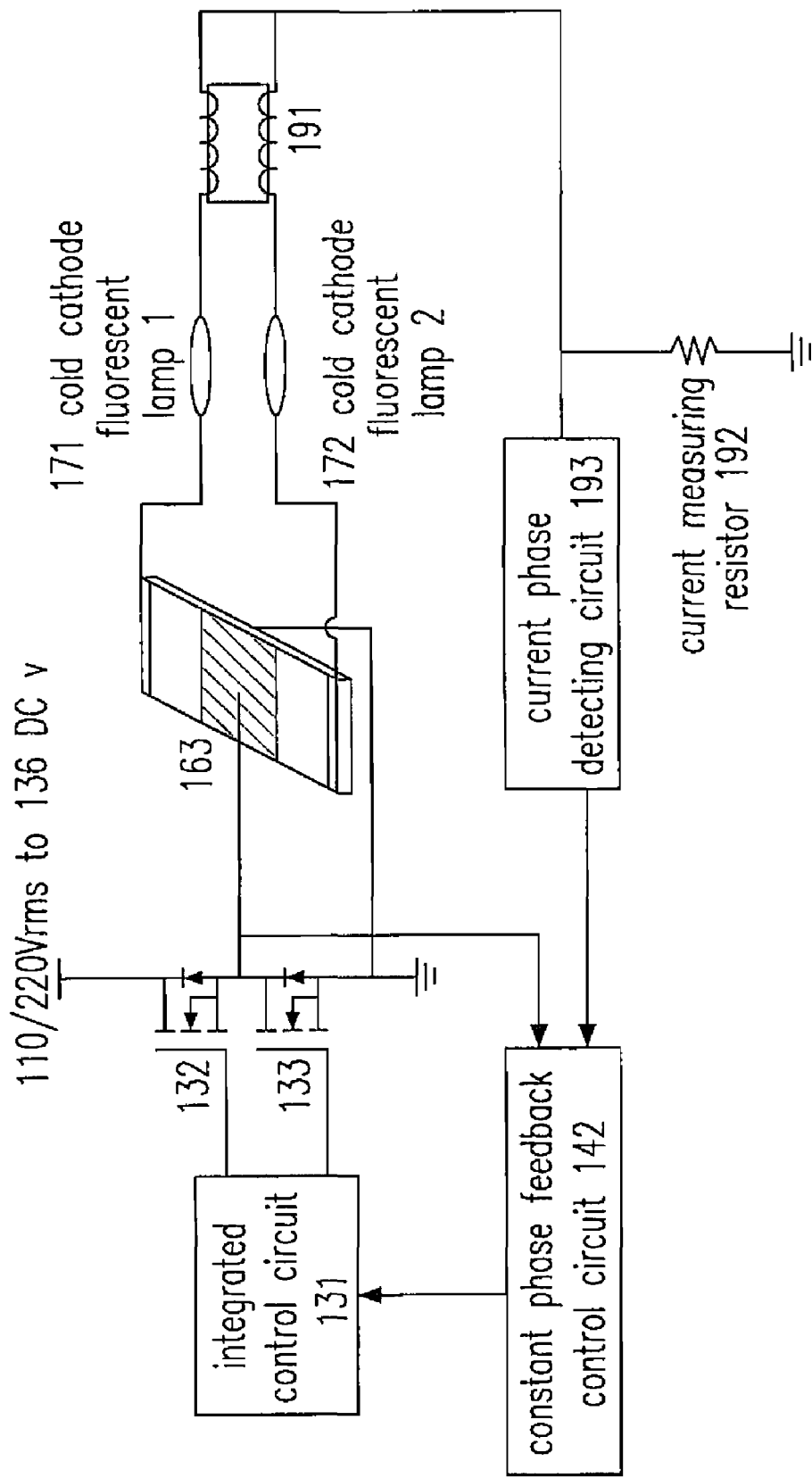

As illustrated by FIG. 19(*a*), the modal piezoelectric transformer 163 driven by square waves are so formed, wherein the driving circuit thereof comprises an integrated control circuit 131 and high voltage transistors 132 and 133 for transforming rectified high voltages from a power. The voltages are transformed by the modal piezoelectric transformer 71 driven by the center thereof for transforming voltages to drive two cold cathode fluorescent lamps 171 and 172, wherein the uniform current control circuit 111 control the pipe currents of the cold cathode fluorescent lamps 171 and 172 to be uniform with the inductor 191, in the constant-current feedback control circuit 1211, the output-current detector 134 detects output currents for the constant-current feedback control 135 to return the operation frequency of the driving circuit 101, and the output-current detector 134 transforms the out put currents into voltage signals simply through the resistor 192 for detection.

FIGS. 19(*a*) and (*b*) approximate each other, wherein there is a dominant difference therebetween that the constant-phase feedback control circuit 1212 operates through the phase difference between the input voltage and the output current for feedback control of a fixed phase. The constant-phase feedback control circuit includes a constant phase feedback control circuit 142 and a constant phase current detector 141, wherein the constant phase feedback control circuit 142 mainly comprises a current-measuring resistor 192 and a current-phase detecting circuit 193. Finally, phases are compared in the constant phase feedback control circuit 142 for adjusting operation frequency through the integrated control circuit 131.

Figure 20A:
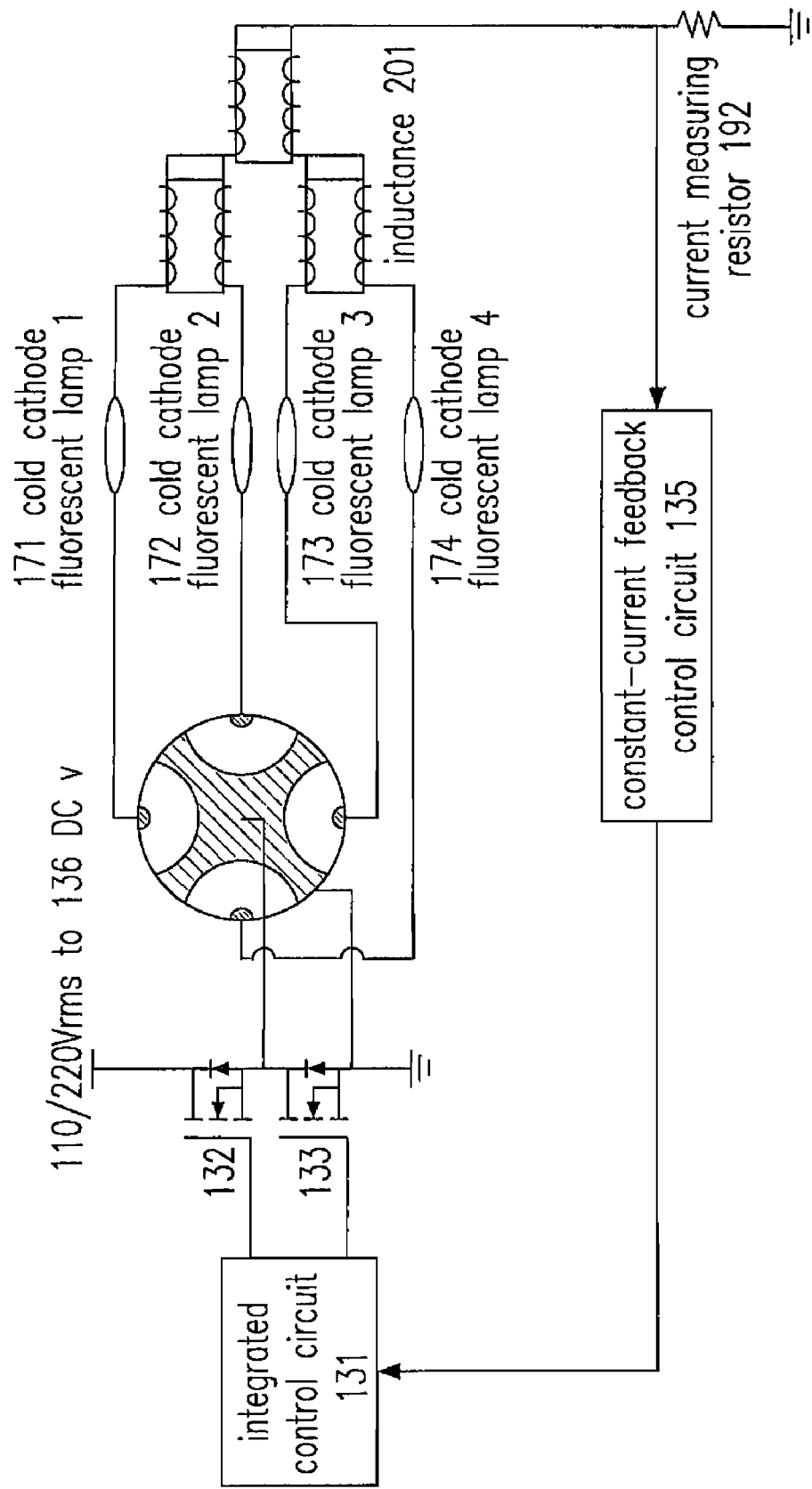
FIG. 20 is a diagram showing the disk-shaped piezoelectric transformer for driving four cold cathode fluorescent lamps through (a) constant-current feedback control and (b) constant-phase difference feedback control according to a preferred embodiment in the present invention.
Figure 20B:
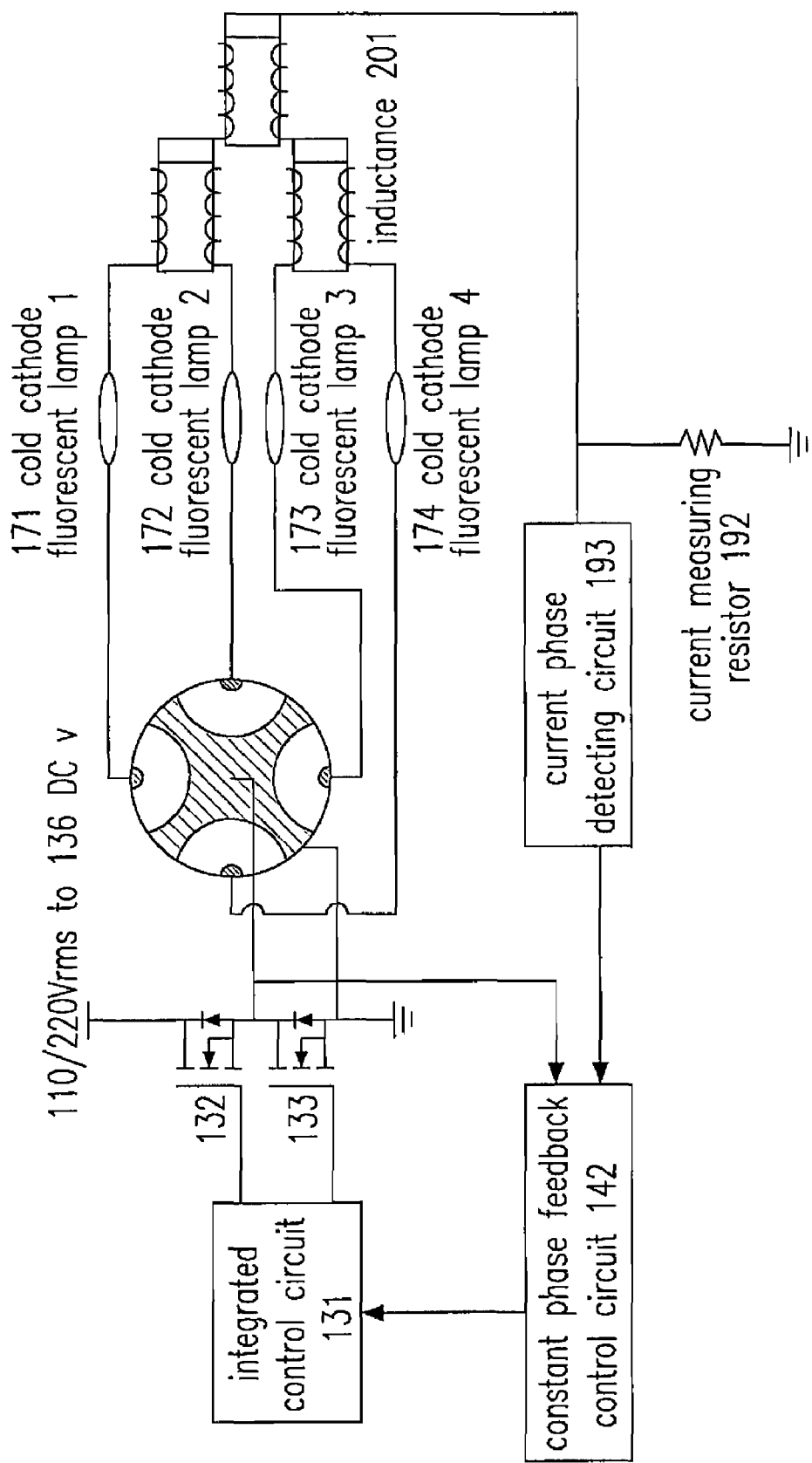

FIGS. 20 (*a*) and (*b*) represent multi-output piezoelectric inverters adopting a disk-shaped quadric-output piezoelectric transformer 71 respectively. FIG. 20(*a*) illustrates the disk-shaped quadric-output piezoelectric transformer 71 driven by square waves through constant-current feedback control, wherein the driving circuit includes the integrated control circuit 131 and high voltage transistors 132 and 133 for transforming rectified high voltages from a power. Subsequently, four cold cathode fluorescent lamps 171, 172, 173 and 174 are driven by the disk-shaped quadric-output piezoelectric transformer 71 through the transformed voltages, wherein the uniform current control circuit 111 controls the pipe currents thereof to be uniform, the constant-current feedback control circuit 1211 detects the outputted currents through the output-current detector 134 for the constant-current feedback control circuit 135 to feedback the operation frequency of the driving circuit 101, and the output-current detector 134 transforms the outputted currents into voltage signals simply through the resistor 192 for detection. FIG. 20(*b*) illustrates the constant phase feedback control process, wherein the constant-phase feedback control circuit 1212 operates through the phase difference between the input voltage and the output current for feedback control of a fixed phase. The constant-phase feedback control circuit includes a constant phase feedback control circuit 142 and a constant phase current detector 141, wherein the constant phase feedback control circuit 142 mainly comprises a current-measuring resistor 192 and a current-phase detecting circuit 193. Finally, the phases are compared in the constant phase feedback control circuit 142 for adjusting operation frequency through the integrated control circuit 131.

To summarize, the present invention proposes a multi-output piezoelectric inverter and a transformer thereof divided into a input terminal and multi-output terminals, wherein the output terminals transform an energy of the mechanical vibration in the transformer into an electrical energy through a piezoelectric effect for driving multiple loads simultaneously, thereby improving the drawbacks of the prior art. Thus, the present invention not only bears novelty and obviously progressive nature, but also bears the utility for the industry.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for driving a dual-output piezoelectric transformer, comprising:

providing a dual-output piezoelectric transformer, which comprises a rectangular piezoelectric piece with a first and second main faces, a pair of input electrodes mounted centrally on the first and the second main faces of the piece, which defines a input section with polarization direction along a thickness direction of the piece of the dual-output piezoelectric transformer, and a first and a second output electrodes mounted around surfaces of two ends of the piece, which defines the first and second output sections with polarization direction being a longitudinal direction of the piece of the dual-output piezoelectric transformer along with the pair of input electrodes;

driving the dual-output piezoelectric transformer to its third mode resonance through backward piezoelectric effect by providing an alternating voltage of the third mode resonant frequency to the input electrodes of the dual-output piezoelectric transformer; and deriving driving signals for at least two loads respectively from the first and second output electrodes of the dual-output piezoelectric transformer through forward piezoelectric effect, wherein each the input electrode is a modal electrode, and A(x), a configuration of each the modal electrode, is configured as the following equation:

$$A(x) = \sin\left(\frac{3\pi x}{L}\right)\left\{H\left[x - \frac{L}{3}\right] - H\left[x - \frac{2L}{3}\right]\right\},$$

wherein L, H and x are a length, a width and a coordinate along the longitudinal direction of the dual-output piezoelectric transformer respectively, and x has a value in the range of [0, L] and counting from one of the two ends.

2. A method for driving a dual-output piezoelectric transformer as claimed in claim 1, wherein the at least two loads are cold cathode fluorescent lamps.

3. A multi-output piezoelectric transformer for driving at least two loads, comprising:
a piezoelectric ceramic disc with a first and second main faces;
a pair of input electrodes mounted centrally on the first and the second main faces of the disc, which defines a input section with polarization direction along a thickness direction of the disc; and
a first and a second output electrodes mounted around surfaces of two diametrically opposite positions of the disc which defines a first and a second output sections with polarization direction being a radial direction of the disc along with the pair of the input electrodes.

4. A multi-output piezoelectric transformer as claimed in claim 3, wherein the pair of input electrodes defines the input section of the disc as an input terminal, the first and the second output electrodes define the first and the second output sections of the disc as two output terminals, the input terminal has a biaxially symmetric electrode configuration, each of the two output terminals has a generally half-circular electrode configuration, the two output terminals are uniaxially symmetrically configured and are separated by the input terminal, the input terminal is driven by inputting an electrical signal thereinto, the electrical signal is transformed to a mechanical vibration through a backward piezoelectric effect for driving the piezoelectric disk to generate a resonant mode of a third resonant frequency for the disk, and the first and the second output terminals respectively transform the mechanical vibration into an electrical energy through a forward piezoelectric effect for driving the at least two loads.

5. A multi-output piezoelectric transformer as claimed in claim 4, wherein the output piezoelectric transformer is a dual-output piezoelectric transformer for driving the at least two loads with a number of two.

6. A multi-output piezoelectric transformer as claimed in claim 4 being a quadruple-output piezoelectric transformer and further comprising:
a third and a fourth output electrodes mounted around surfaces of another two diametrically opposite positions of the disc, which defines a third and a fourth output sections with polarization direction being a radial direction of the disc along with the pair of the input electrodes,
wherein the pair of input electrodes defines the input section of the disc as an driving terminal, the first and the second output electrodes define the first and the second output sections of the disc polarized as a first and a second output terminals, the third and the fourth output electrodes define the third and the fourth output sections t as a third and a fourth output terminals, the driving terminal has a biaxially symmetric electrode configuration, each of the four output terminals has a generally half-circular electrode configuration, the first and the second output terminals are uniaxially symmetrically configured, the third and the fourth output terminals are uniaxially symmetrically configured, the radial directions virtually divide the disc into four equal parts, the input terminal is driven by inputting an electrical signal thereinto, the electrical signal is transformed to a mechanical vibration through a backward piezoelectric effect for driving the piezoelectric disk to generate a resonant mode of a third resonant frequency, and the first, the second, the third and the fourth output terminals respectively transform the mechanical vibration into an electrical energy through a forward piezoelectric effect for driving the at least two loads with a number of four.

7. A multi-output piezoelectric transformer as claimed in claim 4, wherein the at least two loads are cold cathode fluorescent lamps.

* * * * *